United States Patent
Suzuki

(10) Patent No.: US 9,293,183 B2
(45) Date of Patent: Mar. 22, 2016

(54) MAGNETORESISTIVE RANDOM ACCESS MEMORY

(75) Inventor: Kazumasa Suzuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 698 days.

(21) Appl. No.: 13/572,017

(22) Filed: Aug. 10, 2012

(65) Prior Publication Data

US 2013/0039122 A1 Feb. 14, 2013

(30) Foreign Application Priority Data

Aug. 11, 2011 (JP) ................................ 2011-176146

(51) Int. Cl.
- *G11C 11/00* (2006.01)
- *G11C 11/16* (2006.01)
- *G11C 11/15* (2006.01)

(52) U.S. Cl.
CPC ............... *G11C 11/161* (2013.01); *G11C 11/15* (2013.01)

(58) Field of Classification Search
CPC ....... G11C 11/161; G11C 11/16; G11C 11/15
USPC .............................. 365/158, 51; 257/421, 323
See application file for complete search history.

(56) References Cited

U.S. PATENT DOCUMENTS

| 2010/0118581 A1* | 5/2010 | Okayama ........................ 365/51 |
| 2010/0157662 A1 | 6/2010 | Ono et al. |
| 2010/0188890 A1* | 7/2010 | Fukami et al. ................ 365/158 |
| 2010/0214826 A1 | 8/2010 | Fukami et al. |

FOREIGN PATENT DOCUMENTS

| WO | 2006/115275 A1 | 11/2006 |
| WO | 2009/001706 A1 | 12/2008 |
| WO | 2009/037910 A1 | 3/2009 |
| WO | 2009/038004 A1 | 3/2009 |

OTHER PUBLICATIONS

S. Fukami, et al., "Low-Current Perpendicular Domain Wall Motion Cell for Scalable High-Speed MRAM", 2009 Symposium on VLSI Technology Digest of Technical Papers, 2009, pp. 230-231, 12A-2.

* cited by examiner

*Primary Examiner* — Richard Elms
*Assistant Examiner* — Mohammed A Bashar
(74) *Attorney, Agent, or Firm* — Sughrue Mion, PLLC

(57) ABSTRACT

A magnetoresistive random access memory includes a memory cell line in which memory cells are formed and write bit lines. The memory cell line 1 includes a magnetic recording layer, magnetization fixed layers, reference layers, spacer layers, and nMOS transistors. The spacer layer and the reference layer are located between the magnetization fixed layer and the magnetization fixed layer). The magnetization fixed layers have a magnetization fixed to a direction opposite to that of a magnetization of the magnetization fixed layers. The reference layers also have a fixed magnetization direction. The nMOS transistor is provided between the write bit line and the magnetization fixed layer.

5 Claims, 17 Drawing Sheets

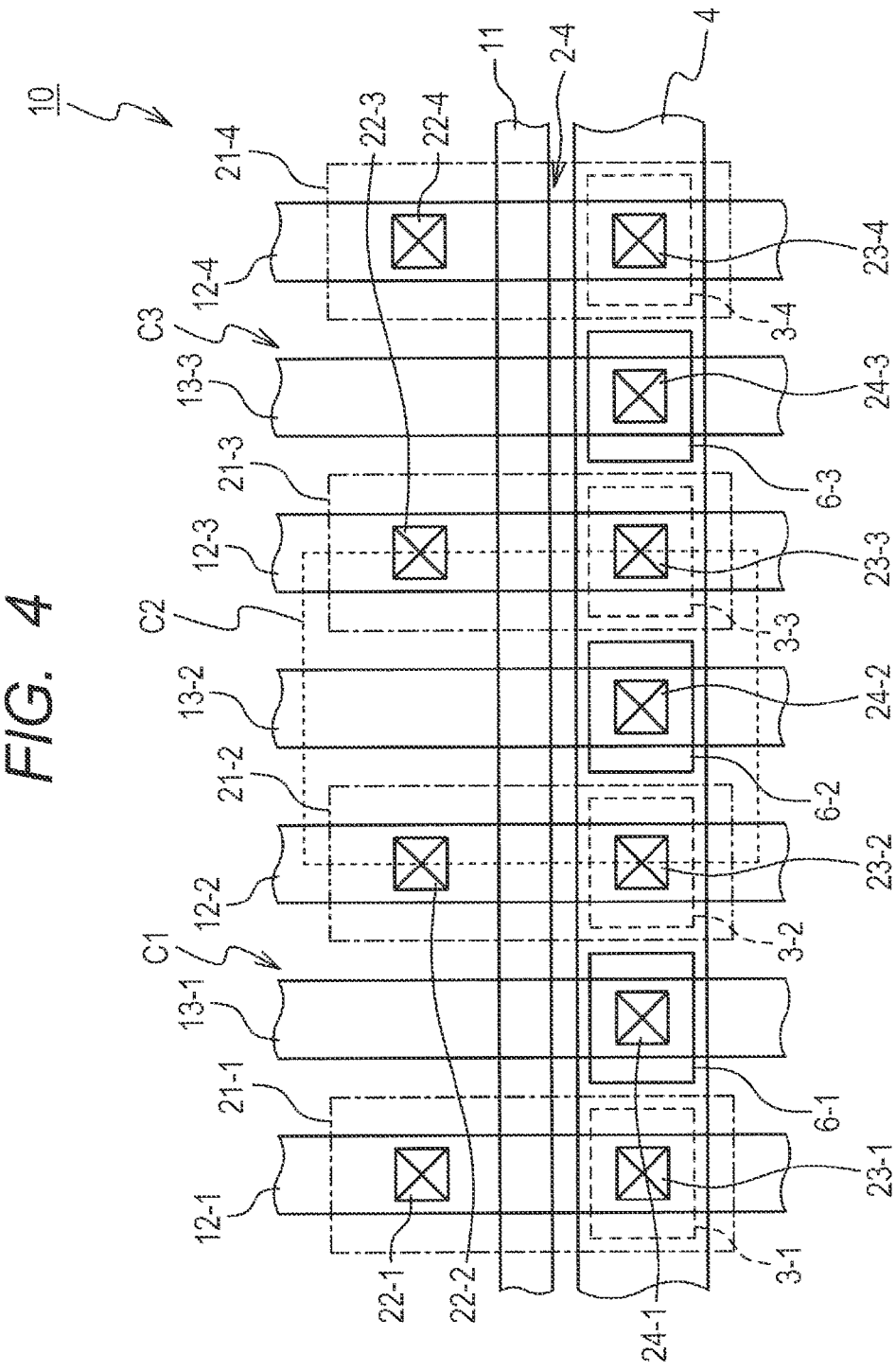

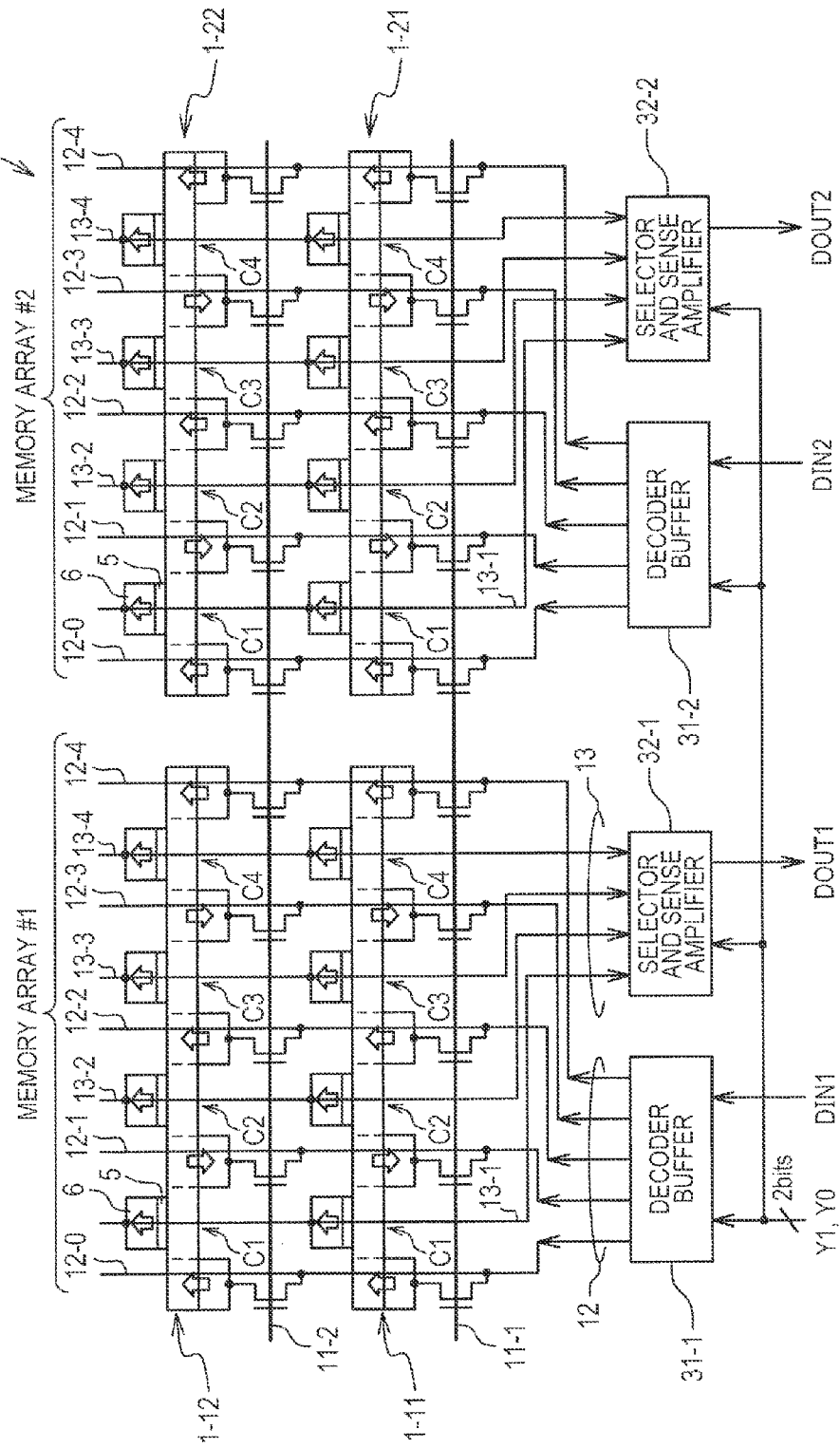

FIG. 8B

| DATA INPUT | Y ADDRESS Y1, Y0 | WRITE BIT LINE 12 01234 |
|---|---|---|
| 0 | 00 | 01111 |
|   | 01 | 11000 |
|   | 10 | 00011 |
|   | 11 | 11110 |
| 1 | 00 | 10000 |
|   | 01 | 00111 |
|   | 10 | 11100 |
|   | 11 | 00001 |

FIG. 8C

| Y ADDRESS Y1, Y0 | CELL SELECTION | OUTPUT CELL CURRENT LARGE/SMALL |
|---|---|---|
| 00 | C1 | 0/1 |
| 01 | C2 | 0/1 |
| 10 | C3 | 0/1 |
| 11 | C4 | 0/1 |

FIG. 8E

| DATA INPUT | Y ADDRESS Bit1,0 | WRITE BIT LINE 12 01234 |
|---|---|---|
| 0 | 00 | 01111 |
|   | 01 | 00111 |
|   | 10 | 00011 |
|   | 11 | 00001 |
| 1 | 00 | 10000 |
|   | 01 | 11000 |
|   | 10 | 11100 |
|   | 11 | 11110 |

FIG. 8F

| Y ADDRESS Y1, Y0 | CELL SELECTION | OUTPUT CELL CURRENT LARGE/SMALL |
|---|---|---|
| 00 | C1 | 0/1 |
| 01 | C2 | 1/0 |
| 10 | C3 | 0/1 |
| 11 | C4 | 1/0 |

MAGNETORESISTIVE RANDOM ACCESS MEMORY

CROSS-REFERENCE TO RELATED APPLICATIONS

The disclosure of Japanese Patent Application No. 2011-176146 filed on Aug. 11, 2011 including the specification, drawings and abstract is incorporated herein by reference in its entirety.

BACKGROUND

The present invention relates to a magnetoresistive random access memory (MRAM), in particular to an MRAM in which data is written using domain wall displacement.

The MRAM is a storage device which uses a magnetic body as a storage element and stores information corresponding to a magnetization direction of the magnetic body. The MRAM is expected as a high-speed and infinitely-rewritable non-volatile memory and is being actively developed.

There are various types of MRAMs and one of them is a so-called domain wall displacement type MRAM. In the domain wall displacement type MRAM, a spin-polarized current is passed through a ferromagnetic layer that stores data (hereinafter may be referred to as "magnetic recording layer" in the present specification) in a direction corresponding to the data and the position of the domain wall is displaced, so that the data is written. For example, the domain wall displacement type MRAM is disclosed in international publications WO2006/115275, WO2009/037910, WO2009/038004, and WO2009/001706 and "Low-Current Perpendicular Domain Wall Motion Cell for Scalable High-Speed MRAM", 2009 Symposium on VLSI Circuits, 12A-2, pp. 230-231. Here, WO2006/115275, WO2009/037910, and WO2009/038004 discloses an MRAM using a magnetic recording layer in which the magnetization direction is in an in-plane direction and WO2009/001706 discloses an MRAM using a magnetic recording layer in which the magnetization direction is in a film thickness direction.

FIG. 1 is a perspective view showing a schematic configuration of a memory cell of one bit of the domain wall displacement type MRAM disclosed in WO2009/001706. The memory cell shown in FIG. 1 includes one MRAM element 101 and two nMOS transistors 102-1 and 102-2. The gates of the nMOS transistors 102-1 and 102-2 are coupled to a word line 111. The MRAM element 101 includes magnetization fixed layers 103-1 and 103-2, a magnetic recording layer 104 formed to bridge the two magnetization fixed layers 103-1 and 103-2, a spacer layer 105 of a thin insulator provided to be in contact with the approximate center of the magnetic recording layer 104, and a reference layer 106 provided over the spacer layer 105.

The magnetization fixed layers 103-1 and 103-2 are ferromagnetic layers having fixed magnetization directions opposite to each other, respectively. In the memory cell shown in FIG. 1, the magnetization direction of the magnetization fixed layer 103-1 is upward and the magnetization direction of the magnetization fixed layer 103-2 is downward. The magnetization fixed layers 103-1 and 103-2 are coupled to write bit lines 112-1 and 112-2 through the nMOS transistors 102-1 and 102-2, respectively.

The magnetic recording layer 104 is a ferromagnetic layer used to store data. The magnetization directions of magnetization fixed domains 107-1 and 107-2 in the magnetic recording layer 104, which are in contact with the magnetization fixed layers 103-1 and 103-2, are fixed to the same directions as those of the magnetization fixed layers 103-1 and 103-2, respectively. The magnetization direction of a magnetization reversal domain 108 between the magnetization fixed domains 107-1 and 107-2 can be reversed in the vertical direction. Data is stored by assigning the magnetization directions of the magnetization reversal domain 108 to data "0" and data "1" respectively. A domain wall with which domains magnetized in opposite directions are in contact is formed on a boundary between the magnetization fixed domain 107-1 and the magnetization reversal domain 108 or on a boundary between the magnetization fixed domain 107-2 and the magnetization reversal domain 108. As described later, in the memory cell shown in FIG. 1, data is written by moving the domain wall by the spin-polarized current.

The reference layer 106 is a magnetic layer having a fixed magnetization direction. In the memory cell shown in FIG. 1, the magnetization direction of the reference layer 106 is fixed upward. For example, the reference layer 106 is formed of SAF (synthetic antiferromagnet) which is formed as a laminated structure of a non-magnetic body and a ferromagnetic body and to which diamagnetism is artificially given. The reference layer 106 is coupled to a read bit line 113.

Data is written by reversing the magnetization direction of the magnetization reversal domain 108 of the magnetic recording layer 104 by moving the domain wall by passing a write current through the magnetization reversal domain 108. When a high potential is applied to the write bit line 112-1, a low potential is applied to the write bit line 112-2, and further a high potential is applied to the word line 111 to turn on both the nMOS transistors 102-1 and 102-2, the write current flows from the write bit line 112-1 to the write bit line 112-2 through the nMOS transistor 102-1, the magnetization fixed layer 103-1, the magnetic recording layer 104, the magnetization fixed layer 103-2, and the nMOS transistor 102-2. Thereby, a flow of electrons whose spins are aligned flows in a direction opposite to the direction of the write current, that is, in a direction from the magnetization fixed domain 107-2 to the magnetization fixed domain 107-1 and the domain wall formed in the magnetic recording layer 104 moves to the side of the magnetization fixed domain 107-1, so that the magnetization direction of the magnetization reversal domain 108 becomes the same as that of the magnetization fixed domain 107-2. On the other hand, when a high potential is applied to the write bit line 112-2, a low potential is applied to the write bit line 112-1, and a high potential is applied to the word line 111 to turn on the nMOS transistors 102-1 and 102-2, the write current flows in the opposite direction, so that the magnetic recording layer 104 moves to the side of the magnetization fixed domain 107-2, so that the magnetization direction of the magnetization reversal domain 108 becomes the same as that of the magnetization fixed domain 107-1. Thereby, data "0" and data "1" can be written. The state of the magnetic recording layer 104 is not changed even when the power is turned off, so that the data is recorded in the magnetic recording layer 104 in a nonvolatile manner.

Data is read by detecting a change of a resistance value of the spacer layer 105 between the magnetic recording layer 104 and the reference layer 106. The reference layer 106 is magnetized in one direction. When the magnetization direction of the magnetization reversal domain 108 located below the reference layer 106 with the spacer layer 105 in between is that same as that of the reference layer 106, the resistance value of the spacer layer 105 decreases and when the magnetization direction is opposite to that of the reference layer 106, the resistance value increases. The resistance value is detected by flowing a read current between the read bit line 113 and the write bit lines 112-1 and 112-2.

FIG. 2 shows a diagram of a layout of the memory cell in FIG. 1. The word line 111 is formed of a polysilicon gate. The nMOS transistor 102-1 is made up of the word line 111 and a diffusion layer 121-1. The nMOS transistor 102-2 is made up of the word line 111 and a diffusion layer 121-2. The sources of the nMOS transistors 102-1 and 102-2 are coupled to the write bit lines 112-1 and 112-2 through vias 122-1 and 122-2, respectively. Here, both the write bit lines 112-1 and 112-2 are formed as metal wiring. Further, the drains of the nMOS transistors 102-1 and 102-2 are coupled to the magnetization fixed layers 103-1 and 103-2 through vias 123-1 and 123-2, respectively. Further, the reference layer 106 is coupled to the read bit line 113 through a via 124. The read bit line 113 is formed as metal wiring.

The memory cell shown in FIGS. 1 and 2 includes two transistors and further three metal wirings in a direction perpendicular to the word line 111, so that the size of the memory cell is constrained. The area of the memory cell shown in FIGS. 1 and 2 has to be larger than that of a memory cell of a DRAM (dynamic random access memory) and a flash memory, which includes only one transistor.

SUMMARY

Therefore, an object of the present invention is to provide a technique for reducing the area of the memory cell of the domain wall displacement type MRAM.

According to an aspect of the present invention, a magnetoresistive random access memory includes a first memory cell line in which first to Nth memory cells are formed (N is an integer greater than or equal to 2) and first to (N+1)th write bit lines. The first memory cell line includes a magnetic recording layer formed of a ferromagnetic body, first to (N+1)th magnetization fixed layers coupled to the magnetic recording layer, first to Nth reference layers provided to face the magnetic recording layer, first to Nth non-magnetic spacer layers inserted between the magnetic recording layer and the first to the Nth reference layers, respectively, and first to (N+1)th transistors. The ith reference layer and the ith spacer layer are located between the ith and the (i+1)th magnetization fixed layers. Odd-numbered magnetization fixed layers among the first to the (N+1)th magnetization fixed layers have a magnetization fixed to a first direction and even-numbered magnetization fixed layers among the first to the (N+1)th magnetization fixed layers have a magnetization fixed to a second direction opposite to the first direction. The first to the Nth reference layers have a magnetization fixed to the first direction or the second direction. The ith transistor is provided between the ith write bit line and the ith magnetization fixed layer.

In this magnetoresistive random access memory, data can be written to the ith memory cell by flowing a current between the ith write bit line and the (i+1)th write bit line through the ith and the (i+1)th transistors.

According to the present invention, it is possible to reduce the area of the memory cell of the domain wall displacement type MRAM.

BRIEF DESCRIPTION OF THE DRAWINGS

FIG. 4 is a plan view showing a layout of a memory cell of the MRAM of the first embodiment;

FIG. 7A is a diagram conceptually showing a configuration of a magnetoresistive random access memory of a second embodiment of the present invention;

FIG. 8B is a truth table showing an example of an operation of a decoder buffer according to the second embodiment;

FIG. 8C is a table showing an example of an operation of a selector sense amplifier according to the second embodiment;

FIG. 8E is a truth table showing another example of the operation of the decoder buffer according to the second embodiment;

FIG. 8F is a table showing another example of the operation of the selector sense amplifier according to the second embodiment;

DETAILED DESCRIPTION

Figure 1:
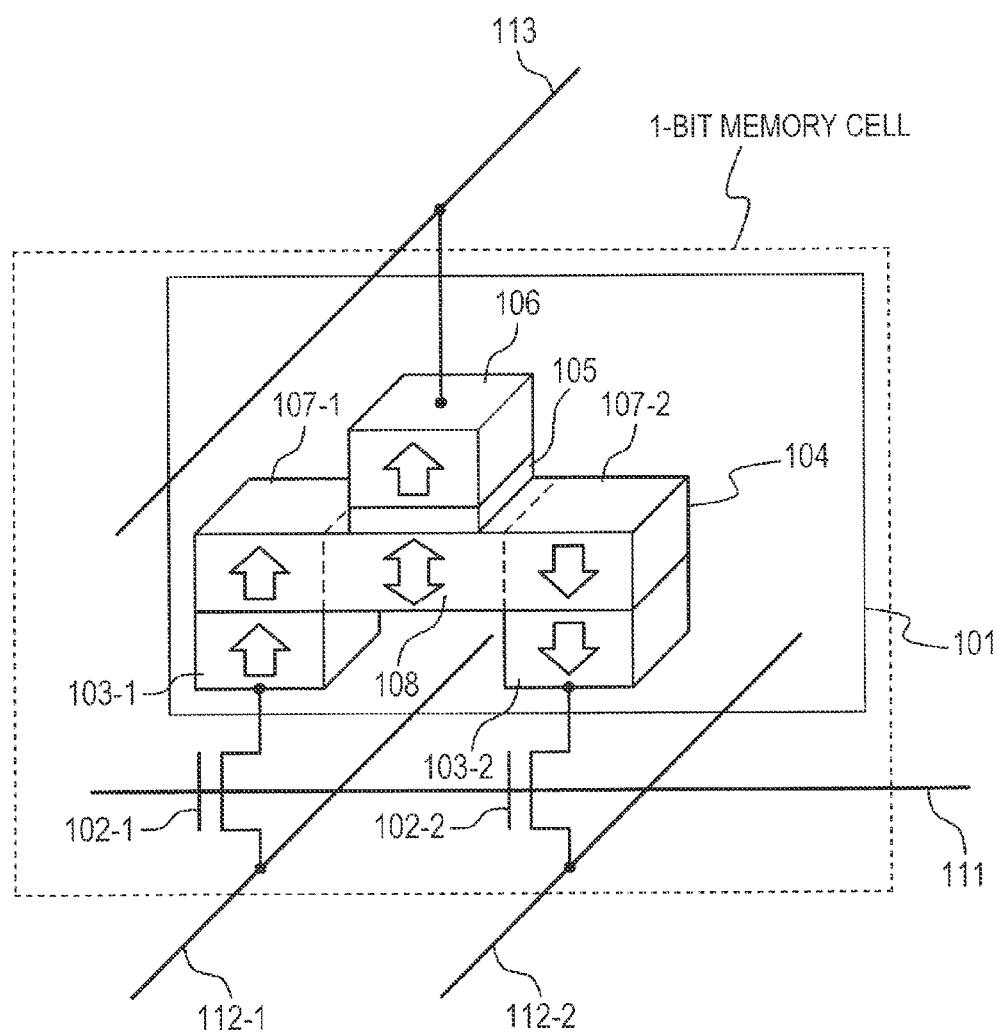
FIG. 1 is a diagram conceptually showing a configuration of a publicly known MRAM.

Hereinafter, embodiments of the present invention will be described with reference to the drawings. In the description below, the same components will be denoted by the same reference numerals. When there are a plurality of the same components, they may be differentiated by branch numbers following a hyphen. However, if they need not be differentiated, the branch numbers may not be added.

First Embodiment

Figure 3:
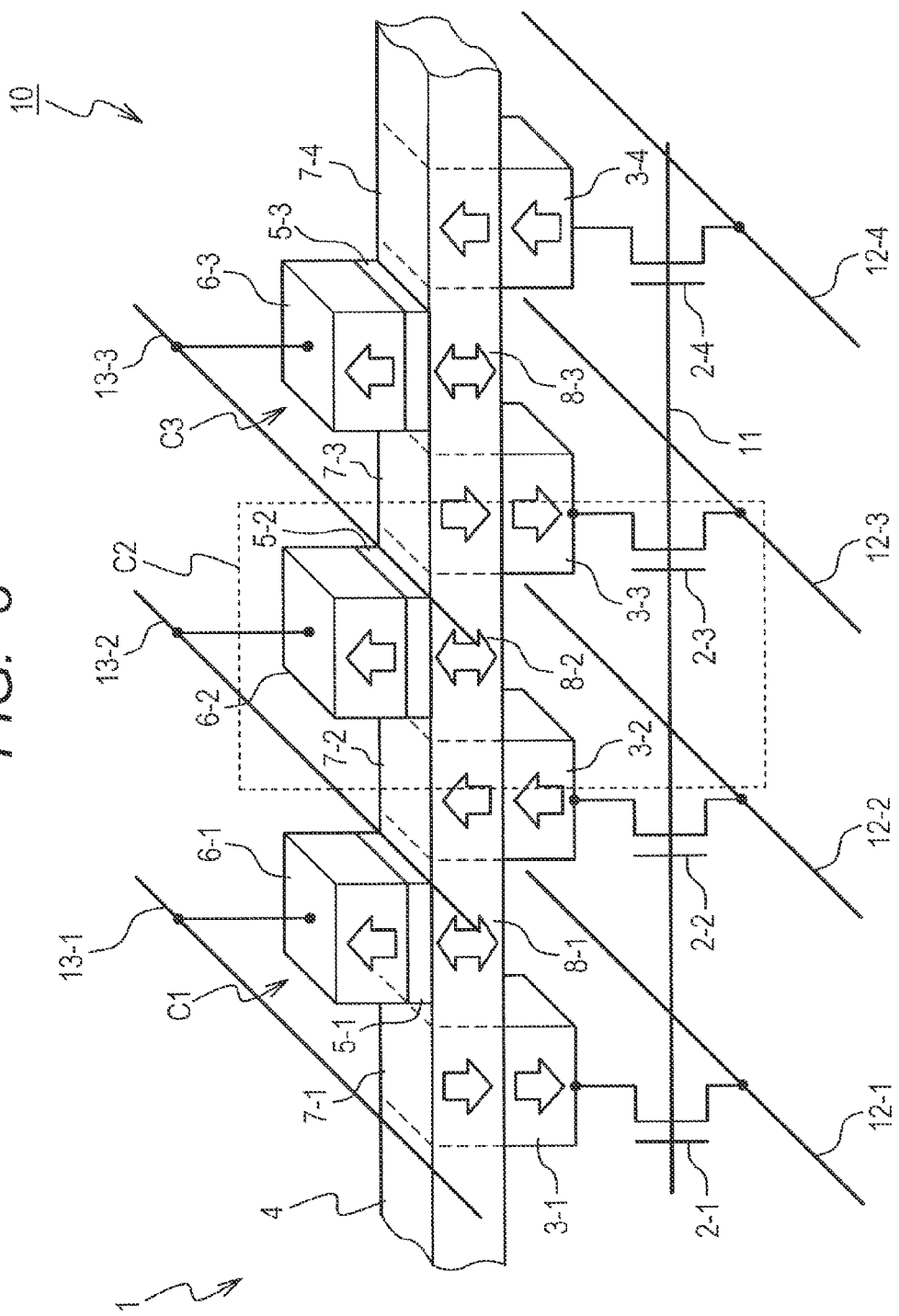
FIG. 3 is a diagram conceptually showing a configuration of an MRAM of a first embodiment of the present invention.

FIG. 3 is a perspective view for explaining a configuration of a memory cell line 1 of a magnetoresistive random access memory 10 of a first embodiment of the present invention.

Here, the memory cell line 1 means an array including a plurality of memory cells aligned in a specific direction.

The memory cell line 1 includes nMOS transistors 2-1 to 2-4, magnetization fixed layers 3-1 to 3-4, a magnetic recording layer 4, spacer layers 5-1 to 5-3, and reference layers 6-1 to 6-3. The nMOS transistors 2-1 to 2-4, the magnetization fixed layers 3-1 to 3-4, the magnetic recording layer 4, the spacer layers 5-1 to 5-3, and the reference layers 6-1 to 6-3 form three memory cells C1 to C3. Although FIG. 3 shows three memory cells included in the memory cell line 1, more memory cells may be coupled to both ends of the three memory cells.

The magnetization fixed layers 3-1 to 3-4 are ferromagnetic layers having fixed magnetization directions respectively. In the present embodiment, the magnetization fixed layers 3-1 to 3-4 are formed to have perpendicular magnetic anisotropy. The magnetization direction of the magnetization fixed layers 3-1 and 3-3 and the magnetization direction of the magnetization fixed layers 3-2 and 3-4 are opposite to each other. In the memory cell shown in FIG. 3, the magnetization direction of the magnetization fixed layers 3-1 and 3-3 is upward and the magnetization direction of the magnetization fixed layers 3-2 and 3-4 is downward. The magnetization fixed layers 3-1 to 3-4 are coupled to write bit lines 12-1 to 12-4 via the nMOS transistors 2-1 to 2-4, respectively.

The magnetic recording layer 4 is a ferromagnetic layer used to store data. In the present embodiment, the magnetic recording layer 4 is also formed to have perpendicular magnetic anisotropy. The magnetization directions of magnetization fixed domains 7-1 to 7-4 in the magnetic recording layer 4, which are in contact with the magnetization fixed layers 3-1 to 3-4 respectively, are fixed to the same directions as those of the magnetization fixed layers 3-1 to 3-4, respectively. The magnetization directions of a magnetization reversal domain 8-1 between the magnetization fixed domains 7-1 and 7-2, a magnetization reversal domain 8-2 between the magnetization fixed domains 7-2 and 7-3, and a magnetization reversal domain 8-3 between the magnetization fixed domains 7-3 and 7-4 can be reversed in the vertical direction. Data are stored as the magnetization directions of the magnetization reversal domains 8-1 to 8-3, respectively. Each of the magnetization reversal domains 8-1 to 8-3 can store 1 bit data.

A domain wall with which domains magnetized in opposite directions are in contact is formed on a boundary between the magnetization fixed domain 7-1 and the magnetization reversal domain 8-1 or on a boundary between the magnetization fixed domain 8-1 and the magnetization reversal domain 7-2. In the same manner, a domain wall is formed on a boundary between the magnetization fixed domain 7-2 and the magnetization reversal domain 8-2 or on a boundary between the magnetization fixed domain 8-2 and the magnetization reversal domain 7-3 and a domain wall is formed on a boundary between the magnetization fixed domain 7-3 and the magnetization reversal domain 8-3 or on a boundary between the magnetization fixed domain 8-3 and the magnetization reversal domain 7-4. As described later, in the memory cell shown in FIG. 3, data are written by moving these domain walls by the spin-polarized current.

The spacer layers 5-1 to 5-3 are provided over upper surfaces of the magnetization reversal domains 8-1 to 8-3 of the magnetic recording layer 4, respectively, and the reference layers 6-1 to 6-3 are provided over upper surfaces of the spacer layers 5-1 to 5-3, respectively. The reference layers 6-1 to 6-3 are provided facing the magnetization reversal domains 8-1 to 8-3 with the spacer layers 5-1 to 5-3 in between. The spacer layers 5-1 to 5-3 are formed of a thin non-magnetic insulating film. The reference layers 6-1 to 6-3 are magnetic layers having a fixed magnetization direction. In the present embodiment, the reference layers 6-1 to 6-3 are also formed to have perpendicular magnetic anisotropy. In the memory cell line 1 shown in FIG. 3, the magnetization direction of the reference layers 6-1 to 6-3 is fixed upward. However, the magnetization direction of the reference layers 6-1 to 6-3 may be fixed downward. For example, the reference layer 6 is formed of SAF (synthetic antiferromagnet) which is formed as a laminated structure of a non-magnetic body and a ferromagnetic body and to which diamagnetism is artificially given. When the magnetization directions of the reference layers 6-1 to 6-3 are the same as those of the magnetization reversal domains 8-1 to 8-3 respectively, the spacer layers 5-1 to 5-3 have low resistance by a tunnel magnetoresistance effect. When the magnetization directions of the reference layers 6-1 to 6-3 are opposite to those of the magnetization reversal domains 8-1 to 8-3 respectively, the spacer layers 5-1 to 5-3 have high resistance by the tunnel magnetoresistance effect. The reference layers 6-1 to 6-3 are coupled to read bit lines 13-1 to 13-3, respectively.

Although the magnetization fixed layer 3, the magnetic recording layer 4, and the reference layer 6 are all described as a ferromagnetic body having perpendicular magnetic anisotropy, the magnetization fixed layer 3, the magnetic recording layer 4, and the reference layer 6 may be a ferromagnetic layer having in-plane magnetic anisotropy, that is, a ferromagnetic layer having magnetization in an in-plane direction. Also in this case, the magnetization direction of the magnetization fixed layers 3-1 and 3-3 and the magnetization direction of the magnetization fixed layers 3-2 and 3-4 are opposite to each other.

FIG. 4 is a layout diagram showing an example of a layout of the magnetoresistive random access memory 10 of the first embodiment. A word line 11 is formed as a polysilicon gate provided to cross diffusion layers 21-1 to 21-4. The nMOS transistor 2-1 is made up of the diffusion layer 21-1 and the word line 11 and the nMOS transistor 2-2 is made up of the diffusion layer 21-2 and the word line 11. Similarly, the nMOS transistor 2-3 is made up of the diffusion layer 21-3 and the word line 11 and the nMOS transistor 2-4 is made up of the diffusion layer 21-4 and the word line 11.

The sources of the nMOS transistors 2-1 to 2-4 are located below the write bit lines 12-1 to 12-4 and coupled to the write bit lines 12-1 to 12-4 through vias 22-1 to 22-4, respectively. On the other hand, the drains of the nMOS transistors 2-1 to 2-4 are located below the magnetization fixed layers 3-1 to 3-4 and coupled to the magnetization fixed layers 3-1 to 3-4 through vias 23-1 to 23-4, respectively.

The magnetic recording layer 4 is extended in a direction parallel to the word line 11 to cover the upper surfaces of the magnetization fixed layers 3-1 to 3-4. The spacer layers 5-1 to 5-3 (not shown in FIG. 4) and the reference layers 6-1 to 6-3 are laminated over the magnetic recording layer 4. The reference layers 6-1 to 6-3 are located below the read bit lines 13-1 to 13-3 and coupled to the read bit lines 13-1 to 13-3 through vias 24-1 to 24-3, respectively.

The write bit lines 12-1 to 12-4 and the read bit lines 13-1 to 13-3 are formed as metal wiring and extended in a direction perpendicular to the word line 11.

Figure 2:
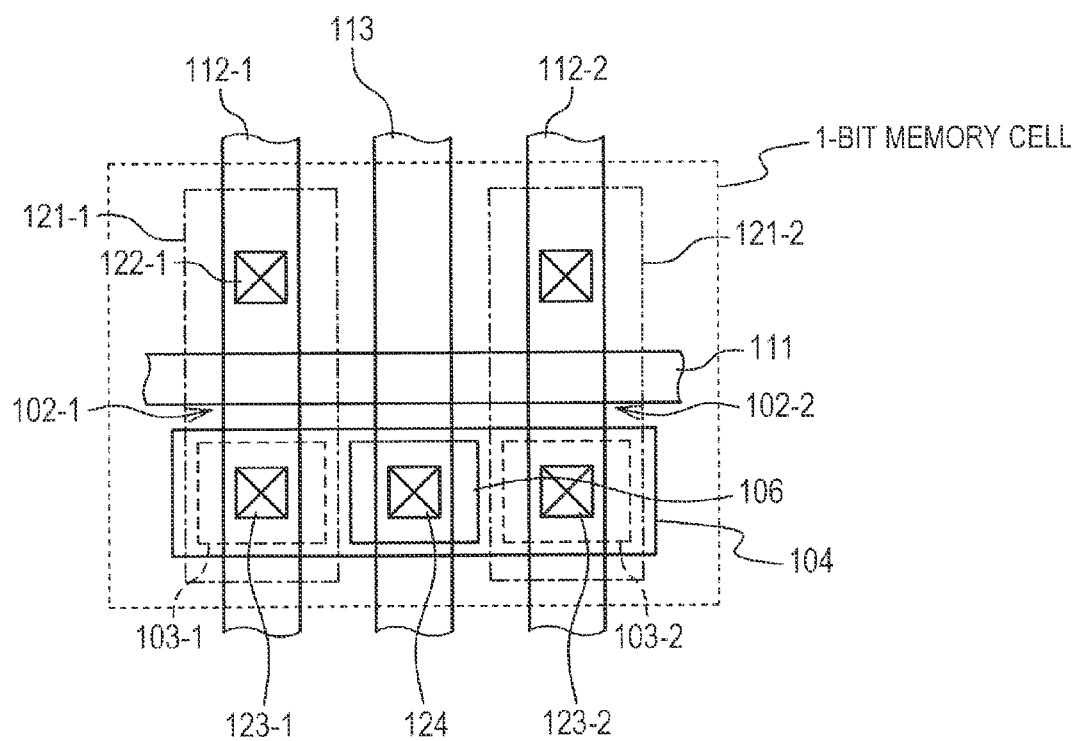
FIG. 2 is a diagram showing a layout of a memory cell of the publicly known MRAM.

In the present embodiment, memory cells C(i−1) and Ci adjacent to each other share the nMOS transistor 2-i, the magnetization fixed layer 3-i, the magnetization fixed domain 7-i, and the write bit line 12-i. For example, the memory cells C1 and C2 share the nMOS transistor 2-2, the magnetization fixed layer 3-2, the magnetization fixed domain 7-2, and the write bit line 12-2. In this way, in the magnetoresistive random access memory 10 of the present embodiment, memory cells adjacent to each other share the nMOS transistor 2-$i$, the magnetization fixed layer 3-$i$, the magnetization fixed domain 7-$i$, and the write bit line 12-$i$, so that the area per memory cell is reduced. For example, the cell area of the memory cell C2 is assumed to be an area between the center line of the diffusion layers 21-2, the via 22-2, and the magnetization fixed layers 3-2 and the center line of the diffusion layers 21-3, the via 22-3, and the magnetization fixed layers 3-3, so that it is possible to form one memory cell in an area which is about a half of the area shown by the layout in FIG. 2.

Next, the operation of the magnetoresistive random access memory 10 according to the first embodiment will be described with reference to FIGS. 5A to 5C and FIGS. 6A and 6B. In the description below, it is assumed that the magnetization direction of the reference layer 6-$i$ is the same as that of the magnetization reversal domain 8-$i$ when data "0" is written to the memory cell C$i$ and the magnetization direction of the reference layer 6-$i$ is the opposite to that of the magnetization reversal domain 8-$i$ when data "1" is written to the memory cell C$i$ is written.

Figure 5A:
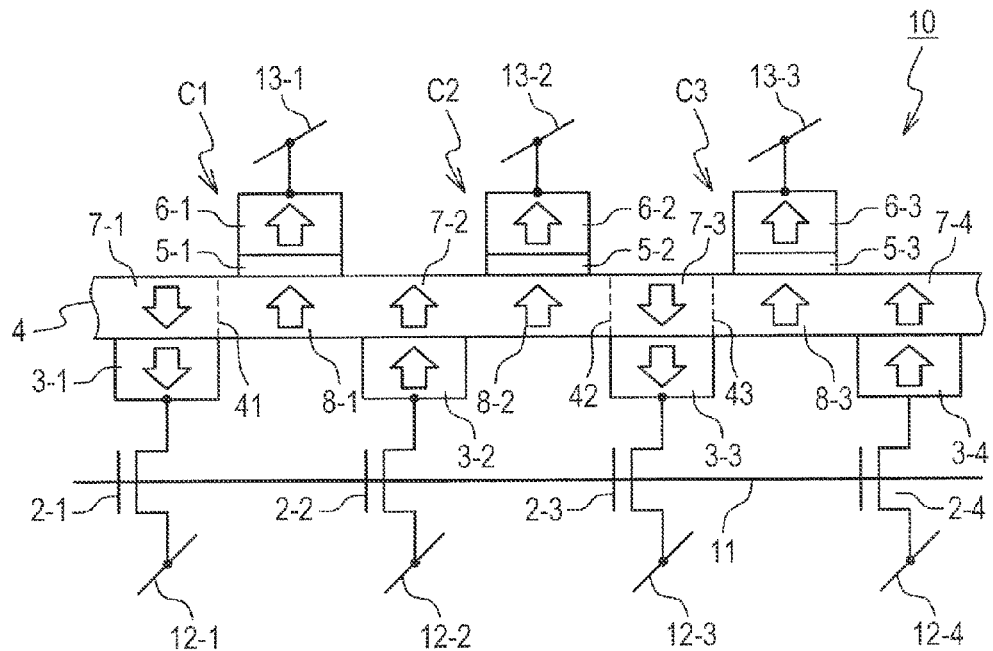
FIG. 5A is a diagram showing a state of the memory cell of the MRAM of the first embodiment before a write operation and a read operation.
Figure 5B:
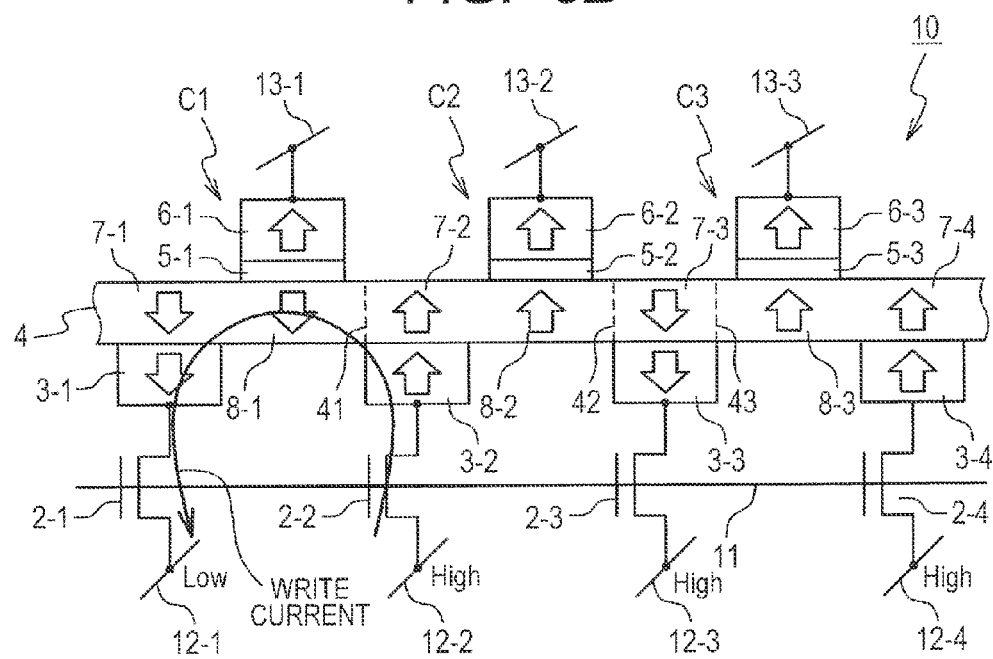
FIG. 5B is a diagram showing a write operation of a memory cell of a magnetoresistive random access memory of the first embodiment.
Figure 5C:
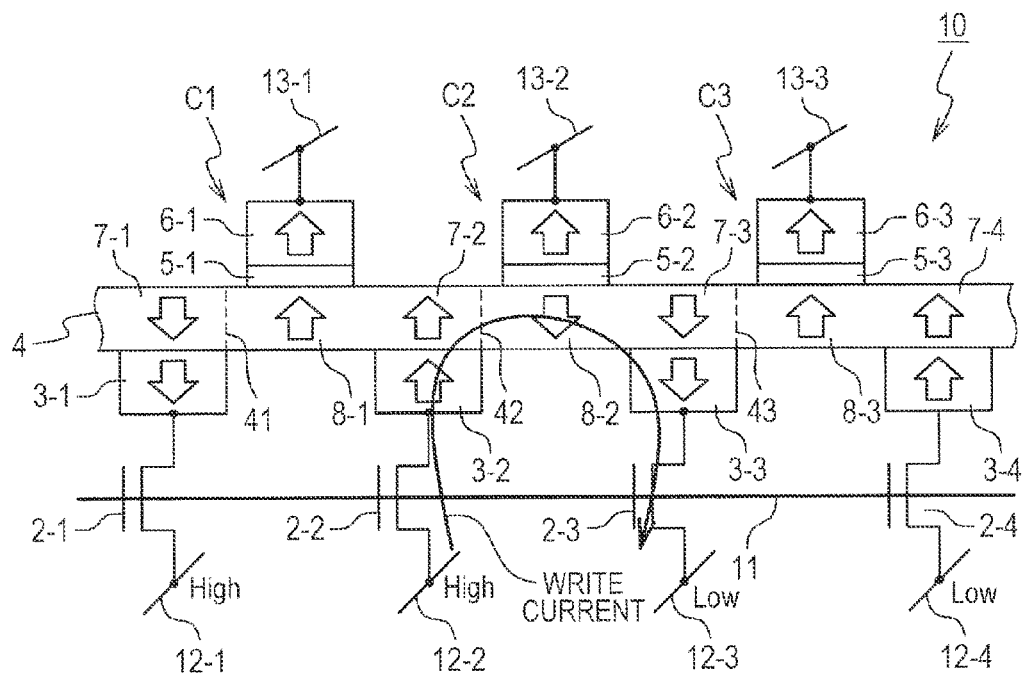
FIG. 5C is a diagram showing the write operation of the memory cell of the magnetoresistive random access memory of the first embodiment.

FIGS. 5A to 5C are diagrams for explaining the writing operation. The left memory cell C1 of the three memory cells C1 to C3 shown in FIGS. 5A to 5C includes the nMOS transistors 2-1 and 2-2, the magnetization fixed layers 3-1 and 3-2, the magnetization fixed domains 7-1 and 7-2, the magnetization reversal domain 8-1, the spacer layer 5-1, and the reference layer 6-1. The center memory cell C2 includes the nMOS transistors 2-2 and 2-3, the magnetization fixed layers 3-2 and 3-3, the magnetization fixed domains 7-2 and 7-3, the magnetization reversal domain 8-2, the spacer layer 5-2, and the reference layer 6-2. The right memory cell C3 includes the nMOS transistors 2-3 and 2-4, the magnetization fixed layers 3-3 and 3-4, the magnetization fixed domains 7-3 and 7-4, the magnetization reversal domain 8-3, the spacer layer 5-3, and the reference layer 6-3.

FIG. 5A shows a state in which data "0" (low resistance state) is written to all the three memory cells C1 to C3. As shown in FIG. 5A, in a state in which data "0" is written to all the memory cells C1 to C3, the domain wall 41 is located on the boundary between the magnetization reversal domain 8-1 and the magnetization fixed domain 7-1, the domain wall 42 is located on the boundary between the magnetization reversal domain 8-2 and the magnetization fixed domain 7-3, and the domain wall 43 is located on the boundary between the magnetization reversal domain 8-3 and the magnetization fixed domain 7-3.

FIG. 5B shows an operation in which data "1" (high resistance state) is written to the memory cell C1 from the state shown in FIG. 5A. As shown in FIG. 5B, when a high potential is applied to the word line 11 while a low potential (Low) is applied to the write bit line 12-1 and a high potential (High) is applied to the write bit line 12-2, the nMOS transistors 2-1 and 2-2 are turned on and a write current flows from the write bit line 12-2 to the write bit line 12-1 through the nMOS transistor 2-2, the magnetization fixed layer 3-2, the magnetic recording layer 4, the magnetization fixed layer 3-1, and the nMOS transistor 2-1. At this time, electrons whose spins are polarized by the magnetization fixed layer 3-1 move in a direction opposite to the write current, so that the domain wall 41 is moved rightward by the flow of the spin-polarized electrons and reaches the boundary between the magnetization reversal domain 8-1 and the magnetization fixed domain 7-2. Thereby, as shown in FIG. 5B, the magnetization direction of the magnetization reversal domain 8-1 is reversed. The magnetization direction of the magnetization reversal domain 8-1 becomes opposite to the magnetization direction of the reference layer 6-1, so that the spacer layer 5-1 of the memory cell C1 becomes a high resistance state. This means that data "1" is written to the memory cell C1.

When a high potential is applied to the write bit line 12-2, the same high potential as that of the write bit line 12-2 is applied to the write bit lines 12-3 and 12-4 so that a current does not flow through the magnetization reversal domains 8-2 and 8-3 of the memory cells C2 and C3. The current does not flow, so that the memory cells C2 and C3 still hold data "0". All the read bit lines 13-1 to 13-3 are set to a floating state so that a current does not flow into the read bit lines 13-1 to 13-3.

When data "0" is written to the memory cell C1, a low potential is applied to the write bit line 12-2 and a high potential is applied to the write bit line 12-1. Thereby, the write current flows in the opposite direction, so that the domain wall 41 moves leftward and reaches the boundary between the magnetization reversal domain 8-1 and the magnetization fixed domain 7-1. At this time, a low potential is applied to the write bit lines 12-3 and 12-4 in the same manner as to the write bit lines 12-2 so that a current does not flow through the magnetization reversal domains 8-2 and 8-3 of the other memory cells C2 and C3. Thereby, the magnetization direction of the magnetization reversal domain 8-1 becomes the same as the magnetization direction of the reference layer 6-1, so that the spacer layer 5-1 of the memory cell C1 becomes a low resistance state. This means that data "0" is written to the memory cell C1.

FIG. 5C shows an operation in which data "1" (high resistance state) is written to the memory cell C2 from the state shown in FIG. 5A in which data "0" is written to the memory cells C1 to C3. When a high potential is applied to the write bit line 12-2, a low potential is applied to the write bit line 12-3, and a high potential is applied to the word line 11 to turn on the nMOS transistors 2-1 to 2-4, the write current flows from the write bit line 12-2 to the write bit line 12-3 through the nMOS transistor 2-2, the magnetization fixed layer 3-2, the magnetization reversal domain 8-2, the magnetization fixed layer 3-3, and the nMOS transistor 2-3. The spin-polarized electrons flow in a direction opposite to the write current, so that the domain wall 42 moves left and reaches the boundary between the magnetization reversal domain 8-2 and the magnetization fixed domain 7-2. Thereby, the magnetization direction of the magnetization reversal domain 8-2 is reversed to be opposite to that of the reference layer 6-2, so that the spacer layer 5-2 of the memory cell C2 becomes a high resistance state. This means that data "1" is written to the memory cell C2. At this time, the same high potential as that of the write bit line 12-2 is applied to the write bit line 12-1 and the same low potential as that of the write bit line 12-3 is applied to the write bit line 12-4 so that the write current does not flow through the magnetization reversal domains 8-1 and 8-3 of the memory cells C1 and C3. The write current does not flow, so that the memory cells C1 and C3 still hold data "0".

Figure 6A:
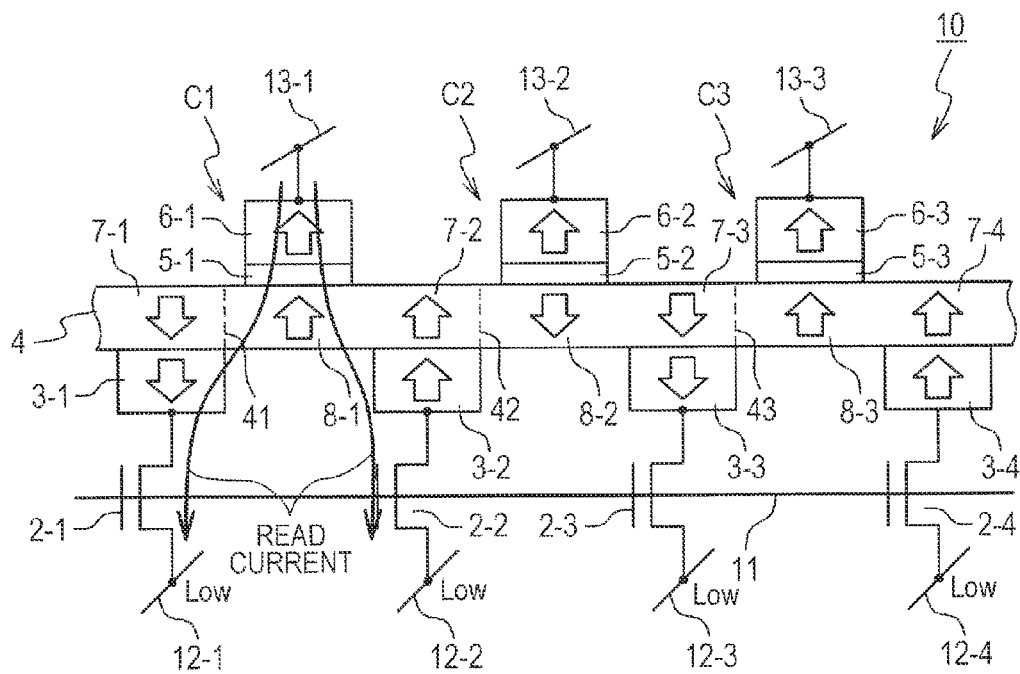
FIG. 6A is a diagram showing a read operation of the memory cell of the magnetoresistive random access memory of the first embodiment.
Figure 6B:
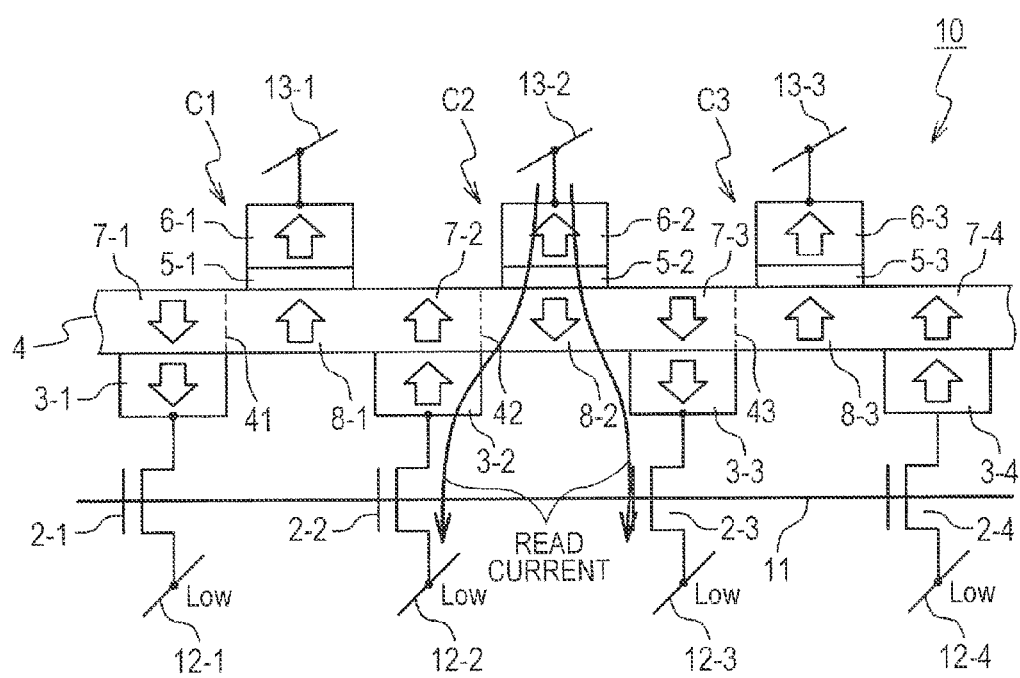
FIG. 6B is a diagram showing the read operation of the memory cell of the magnetoresistive random access memory of the first embodiment.

FIGS. 6A and 6B are diagrams for explaining a read operation. FIG. 6A shows a read operation of the left memory cell C1. In the read operation, a low potential is applied to all the write bit lines 12-1 to 12-4. When a read potential $V_{READ}$ is applied to the read bit line 13-1, a read current flows from the read bit line 13-1 to the write bit lines 12-1 and 12-2 through the reference layer 6-1, the spacer layer 5-1, the magnetization reversal domain 8-1, the magnetization fixed layers 3-1 and 3-2, and the nMOS transistors 2-1 and 2-2. The potential $V_{READ}$ applied to the read bit line 13-1 during the read operation is lower than the high potential (High) applied to the write bit line 12 during the write operation. The read current flowing through the spacer layer 5-1, which is an insulation layer, is adjusted to be a small current which is smaller than the write current applied during the write operation and which does not move the domain wall 41. The resistance value of the spacer layer 5-1 varies depending on the magnetization direction of the magnetization reversal domain 8-1, that is, depending on the data stored in the memory cell C1, so that it is possible to determine whether the data stored in the memory cell C1 is "0" or "1" by detecting the magnitude of the flowing read current. It is possible to determine the data by flowing a certain read current and detecting a voltage generated in the spacer layer 5-1 instead of detecting the magnitude of the read current.

A low potential is applied to the read bit lines 13-2 and 13-3 corresponding to the memory cells C2 and C3 from which data is not read, in the same manner as to the write bit lines 12-1 to 12-4. All the write bit lines 12-1 to 12-4 are low potential, so that the read current also flows through the write bit lines 12-3 and 12-4. However the read current does not affect the detection of the read current because the read current that should be detected surely passes through the spacer layer 5-1. Although there are current paths from the spacer layers 5-2 and 5-3 to the read bit lines 13-2 and 13-3, the current that flows into the read bit lines 13-2 and 13-3 is very small because whereas the resistance of the magnetic recording layer 4 is several hundred Ω, the resistance of the spacer layers 5-1 to 5-3 is ten or more times the resistance of the magnetic recording layer 4, so that the current hardly affects the read operation. In the same manner as in the write operation, the read bit lines 13-2 and 13-3 may be open.

FIG. 6B shows a read operation of the center memory cell C2. A low potential is applied to all the write bit lines 12-1 to 12-4 and the same low potential is applied to the read bit lines 13-1 and 13-3. When a read potential $V_{READ}$ is applied to the read bit line 13-2, a read current flows from the read bit line 13-2 to the write bit lines 12-2 and 12-3 through the reference layer 6-2, the spacer layer 5-2, the magnetization reversal domain 8-2, the magnetization fixed layers 3-2 and 3-3, and the nMOS transistors 2-2 and 2-3. The determination of the data stored in the memory cell C2 is the same as that in the read operation of the memory cell C1 described above.

In the magnetoresistive random access memory 10 of the first embodiment, to reduce the area of the memory cells C1 to C3, memory cells adjacent to each other are coupled to share the nMOS transistor 2-*i*, the magnetization fixed layer 3-*i*, the magnetization fixed domain 7-*i*, and the write bit line 12-*i*. By employing the configuration as described above, the area of the memory cell of the magnetoresistive random access memory 10 of the present invention is reduced to about a half of that shown in FIG. 1.

In the magnetoresistive random access memory 10 of the present invention, memory cells adjacent to each other are coupled, so that a current path to an adjacent memory cell is formed. However, the problem of formation of the current path is solved by applying a calculated bias voltage. Specifically, in the write operation, a high potential (or a low potential) is applied to a write bit line 12, which is located on one side of a cell to which data is written, of a plurality of write bit lines 12 coupled to the same magnetic recording layer 4, and a low potential (or a high potential) is applied to a write bit line 12 which is located on the opposite side of the cell. Thereby, the write current is flowed through only the cell to which the data is written and the write current does not flow through the other memory cells. In the read operation, a low potential is applied to all the write bit lines 12 and the read voltage $V_{READ}$ is applied to the read bit line 13 corresponding to the memory cell to which the data is written. Although there are current paths to other memory cells, all the read currents flow through the spacer layer 5-1 of the memory cell to which the data is written, so that the current paths do not affect the detection of the resistance value.

Second Embodiment

FIG. 7A is a circuit diagram showing a configuration of magnetoresistive random access memory 10A of a second embodiment of the present invention. In the second embodiment, the magnetoresistive random access memory 10 stated in the first embodiment is applied to an embedded memory macro included in a system-on-chip LSI (large scale integrated circuit). The embedded memory macro has a configuration in which a multi-bit data such as 32-bit data and 64-bit data can be write at the same time and can be read at the same time. Specifically, the embedded memory macro has a configuration in which a plurality of memory arrays configured to perform input and output operations of 1 bit data are arranged in parallel.

In the present embodiment, the size of the memory cell is smaller than that of peripheral circuits, so that, in the same manner as in memory macros of other methods such as SRAM (static random access memory), a plurality of memory cell lines are arranged in each memory array corresponding to 1 bit data input and output operations, and in each memory array, one memory cell line to be accessed is selected by a part of bits of an address.

FIG. 7A shows a configuration of memory arrays #1 and #2 corresponding to 2-bit data input and output operations. The memory array #1 is provided with memory cell lines 1-11 and 1-12 and the memory array #2 is provided with memory cell lines 1-21 and 1-22. Four memory cells C1 to C4 are arranged in a horizontal direction in each of the memory cell lines 1-11, 1-12, 1-21, and 1-22. A word line 11-1 is provided along the memory cell lines 1-11 and 1-12 and a word line 11-2 is provided along the memory cell lines 1-12 and 1-22. In addition, four read bit lines 13-1 to 13-4 and five write bit lines 12-0 to 12-4 are provided to each of the memory arrays #1 and #2. Here, note that the number of the write bit lines of each of the memory arrays #1 and #2 is five because the memory cells at both ends have no memory cell with which the memory cells share a write bit line even though the intermediate write bit lines 12-1 to 12-3 are shared by memory cells adjacent to each other.

The magnetoresistive random access memory 10A further includes decoder buffers 31-1 and 31-2 and selector sense amplifiers 31-1 and 32-2. The decoder buffer 31-1 is a write circuit used to write data to the memory cells in the memory array #1 and the selector sense amplifier 32-1 is a read circuit used to read data from the memory cells in the memory array #1. Similarly, the decoder buffer 31-2 is a write circuit used to write data to the memory cells in the memory array #2 and the selector sense amplifier 32-2 is a read circuit used to read data from the memory cells in the memory array #2.

Note that FIG. 7A shows a part of the configuration of the memory arrays #1 and #2 for description. In the memory arrays #1 and #2, generally, many memory cell lines are arranged in a vertical direction in order to realize a large memory capacity. The number of data input/output units, that is, the number of memory arrays, is not limited to two, and the embedded memory macro generally has a configuration where multiple bits such as 32 bits and 64 bits can be inputted and outputted.

Figure 7B:
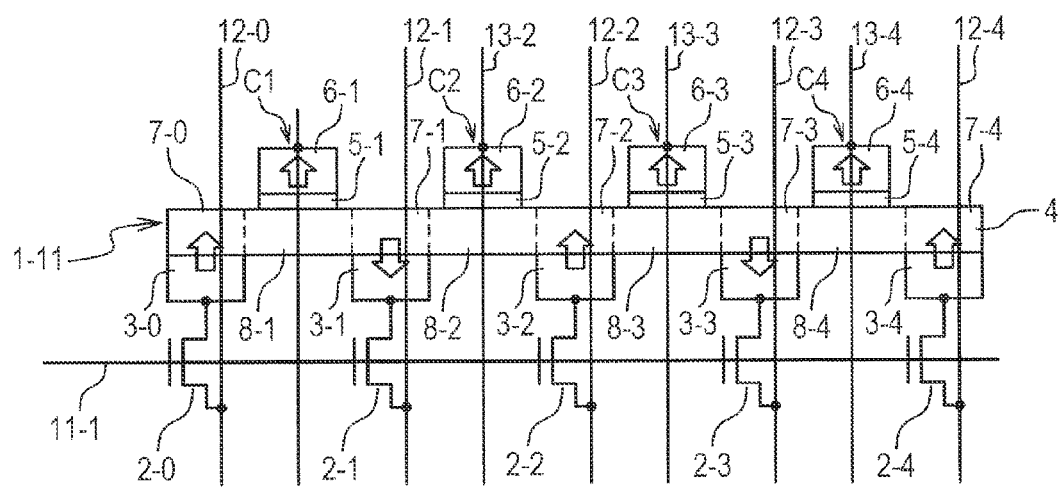
FIG. 7B is a diagram conceptually showing a configuration of a memory cell line of the magnetoresistive random access memory of the second embodiment.

FIG. 7B shows a configuration of the memory cell line 1-11. The memory cell line 1-11 has the same configuration as that of the first embodiment except that the number of the memory cells is different. Specifically, the memory cell line 1-11 includes the nMOS transistors 2-0 to 2-4, the magnetization fixed layers 3-0 to 3-4, the magnetic recording layer 4, the spacer layers 5-1 to 5-4, and the reference layers 6-1 to 6-4. The nMOS transistors 2-0 to 2-4, the magnetization fixed layers 3-0 to 3-4, the magnetic recording layer 4, the spacer layers 5-1 to 5-4, and the reference layers 6-1 to 6-4 form four memory cells C1 to C4. The magnetization fixed layers 3-0, 3-2, and 3-4 have a magnetization direction fixed to upward and the magnetization fixed layers 3-1 and 3-3 have a downward magnetization. The reference layers 6-1 to 6-4 are magnetized in the same direction. In the present embodiment, the reference layers 6-1 to 6-4 are magnetized in the same direction as the magnetization direction of the magnetization fixed layers 3-0, 3-2, and 3-4. The magnetic recording layer 4 includes the magnetization fixed domains 7-0 to 7-4 coupled to the magnetization fixed layers 3-0 to 3-4 respectively and the magnetization reversal domains 8-1 to 8-4 coupled to the spacer layers 5-1 to 5-4 respectively. The magnetization fixed layers 3-0 to 3-4 are coupled to the drains of the nMOS transistors 2-0 to 2-4 respectively, the sources of the nMOS transistors 2-0 to 2-4 are coupled to the write bit lines 12-0 to 12-4 respectively, and the gates of the nMOS transistors 2-0 to 2-4 are coupled to the word line 11-1. The reference layers 6-1 to 6-4 are coupled to the read bit lines 13-1 to 13-4. The other memory cell lines 1-12, 1-21, and 1-22 also have the same configuration as that of the memory cell line 1-11 shown in FIG. 7B.

In the second embodiment, when the magnetization reversal domains 8-1 to 8-4 located below the reference layers 6-1 to 6-4 are magnetized in the same direction as the magnetization direction of the magnetization fixed layers 3-0, 3-2, and 3-4, the resistance of the spacer layers 5-1 to 5-4 decreases and data "0" is held in the memory cells C1 to C4. On the other hand, when the magnetization reversal domains 8-1 to 8-4 are magnetized in the same direction as the magnetization direction of the magnetization fixed layers 3-1 and 3-3, the resistance of the spacer layers 5-1 to 5-4 increases and data "1" is held in the memory cells C1 to C4.

Let us return to FIG. 7A. The word line 11-1 or 11-2 is selected according to address bits other than Y address bits Y1 and Y0. The address bits other than the Y address bits Y1 and Y0 are decoded to select a word line 11. A high potential is applied to the selected word line 11, so that one memory cell line is selected in each of the memory arrays #1 and #2. For example, if a high potential is applied to the word line 11-1, the memory cell line 1-11 is selected in the memory array #1 and the memory cell line 1-21 is selected in the memory array #2.

One of the write bit lines 12-0 to 12-5 of each of the memory arrays #1 and #2 is selected by the decoder buffer circuits 31-1 and 31-2. When writing data, the decoder buffer circuit 31-1 controls potentials applied to the write bit lines 12-0 to 12-5 according to a data bit inputted into a data input port DIN1 and the two bits of Y address bits Y1 and Y0 so that a write current flows through a memory cell to which data should be written in the memory array #1. In the same way, the decoder buffer circuit 31-2 controls potentials applied to the write bit lines 12-0 to 12-5 according to a data bit inputted into a data input port DIN2 and Y address bits Y1 and Y0 so that a write current flows through a memory cell to which data should be written in the memory array #2.

On the other hand, one of the read bit lines 13-1 to 13-4 of each of the memory arrays #1 and #2 is selected by the selector sense amplifiers 32-1 and 32-2. When reading data, the selector sense amplifiers 32-1 and 32-2 select one read bit line from the read bit lines 13-1 to 13-4 according to the address bits Y1 and Y0 and the potential $V_{READ}$ is applied to the selected read bit line. Further, the selector sense amplifiers 32-1 and 32-2 determine whether the data stored in the memory cell, in which the data to be read is stored, is "0" or "1" from the current flowing through the selected read bit line. The determined data are outputted from data output ports DOUT1 and DOUT2.

Figure 8A:
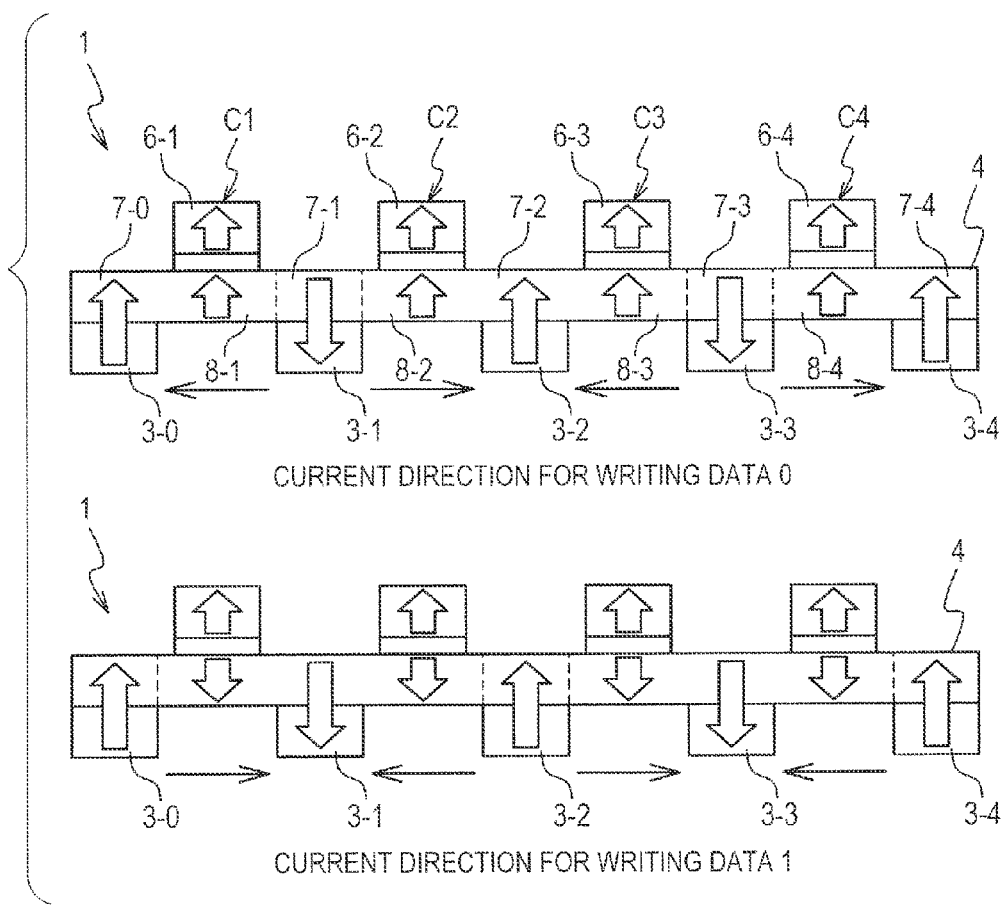
FIG. 8A is a diagram showing an example of a write operation of the memory cell according to the second embodiment.

FIG. 8A to 8C are diagrams for explaining operations of the decoder buffers 31-1 and 31-2 and the selector sense amplifiers 32-1 and 32-2 in the second embodiment. As shown in FIG. 8A, the magnetization fixed layers 3-0, 3-2, and 3-4 which have an upward magnetization direction and the magnetization fixed layers 3-1 and 3-3 which have a downward magnetization direction are alternately arranged, so that, in order to cause the magnetization direction of the magnetization reversal domains 8-1 to 8-4 to be the same as that of the magnetization fixed layers 3-0, 3-2, and 3-4 (in other words, in order to write data "0"), it is necessary to flow the write current in a direction from the magnetization fixed layers 3-1 and 3-3 to the magnetization fixed layers 3-0, 3-2, and 3-4 and move the domain walls. Therefore, it is possible to write data "0" by flowing the write current from the write bit line 12-1 to the write bit line 12-0 for the memory cell C1, flowing the write current from the write bit line 12-1 to the write bit line 12-2 for the memory cell C2, flowing the write current from the write bit line 12-3 to the write bit line 12-2 for the memory cell C3, and flowing the write current from the write bit line 12-3 to the write bit line 12-4 for the memory cell C4. It is possible to write data "1" by flowing the write current in the opposite direction.

FIG. 8B is a truth table showing output values of the decoder buffers 31-1 and 31-2 for realizing the operation described above. In the truth table, "0" in the fields of the write bit line 12 represents a low potential (Low) and "1" represents a high potential (High). For example, when the data input ports DIN1 and DIN2 are "0" and the Y address bits Y1 and Y0 are "00", the write operation to the memory cell C1 is performed. In this case, the decoder buffers 31-1 and 31-2 set the write bit lines 12-0 to 12-4 to "0, 1, 1, 1, and 1" respectively. When the data input ports DIN1 and DIN2 are "0" and the Y address bits Y1 and Y0 are "01", an operation to write data "0" to the memory cell C2 is performed and the decoder buffers 31-1 and 31-2 set the write bit lines 12-0 to 12-4 to "1, 1, 0, 0, and 0" respectively. If the write bit lines 12-0 to 12-4 are set as described above, the memory cells C1 to C4 becomes a low resistance state when holding data "0" and becomes a high resistance state when holding data "1". In this case, as shown in FIG. 8C, the selector sense amplifiers 32-1 and 32-2 may determine that the data is "0" when the read current is large and may determine that the data is "1" when the read current is small even if the data is read from any one of the memory cells C1 to C4.

Figure 8D:
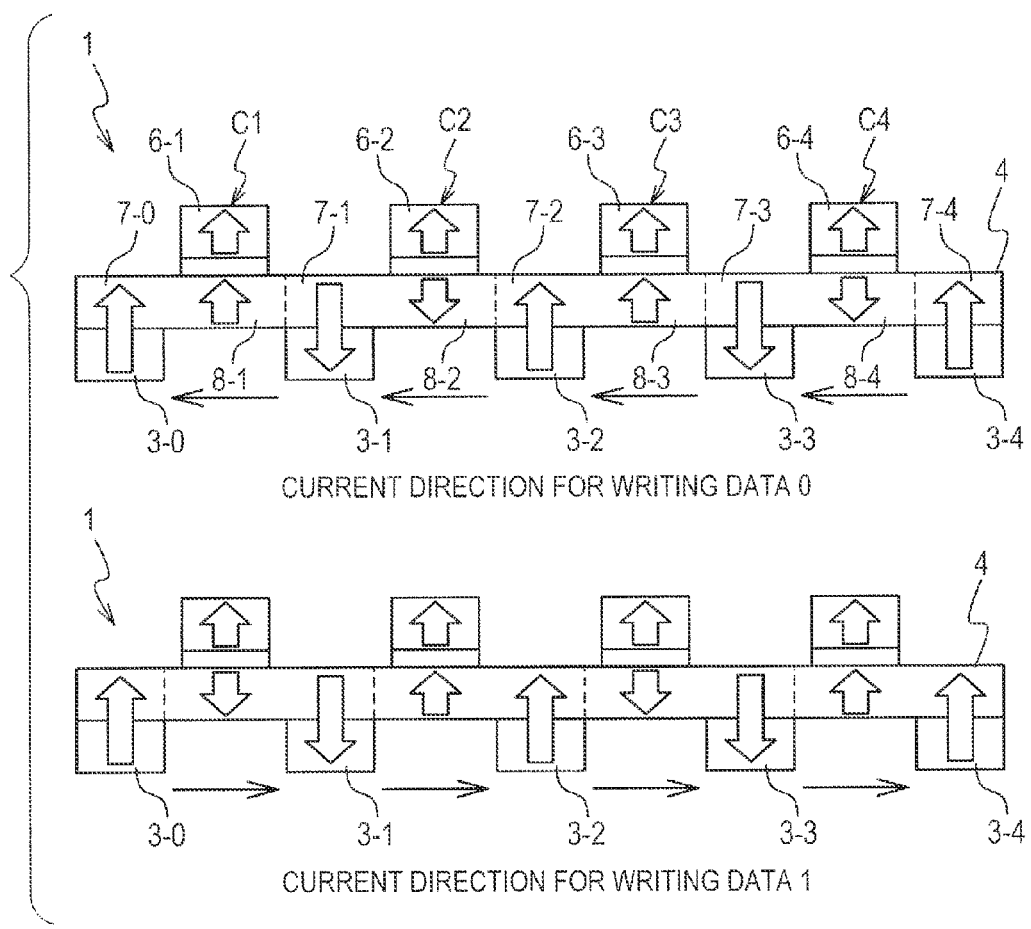
FIG. 8D is a diagram showing another example of the write operation of the memory cell according to the second embodiment.

FIGS. 8D to 8F are diagrams for explaining a modified example of the operations of the decoder buffers 31-1 and 31-2 and the selector sense amplifiers 32-1 and 32-2 in the second embodiment. In the operations shown in FIGS. 8D to 8F, to simplify the operation of the decoder buffers 31-1 and 31-2, a data holding method of the memory cells C1 to C4 is changed. Specifically, in the memory cells C1 and C3, a low resistance state is assigned to data "0" and a high resistance state is assigned to data "1". On the other hand, in the memory cells C2 and C4, the low resistance state is assigned to data "1" and the high resistance state is assigned to data "0".

By doing so, in each memory cell line 1, when writing data "0", the write current is flowed from right to left (that is, a direction from the write bit line 12-4 to the write bit line 12-0), and when writing data "1", the write current is flowed from left to right (that is, a direction from the write bit line 12-0 to the write bit line 12-4). On the other hand, in a read operation, the operation of the selector sense amplifiers 32-1 and 32-2 to the memory cells C1 and C3 is different from that to the memory cells C2 and C4. For the memory cells C1 and C3, the selector sense amplifiers 32-1 and 32-2 determine that the read data is data "0" when the read current is greater than a predetermined reference current and determine that the read data is data "1" when the read current is smaller than the predetermined reference current. On the other hand, for the memory cells C2 and C4, the selector sense amplifiers 32-1 and 32-2 determine that the read data is data "0" when the read current is smaller than a predetermined reference current and determine that the read data is data "1" when the read current is greater than the predetermined reference current. This can be easily realized by reversing the detection result of the resistance of MJT when the lower bit Y0 of the Y address is 1. The operations shown in FIGS. 8D to 8F have an advantage to simplify the operation of the decoder buffers 31-1 and 31-2.

Also in the magnetoresistive random access memory 10A of the second embodiment, to reduce the area per memory cell, memory cells adjacent to each other share the nMOS transistor 2-*i*, the magnetization fixed layer 3-*i*, the magnetization fixed domain 7-*i*, and the write bit line 12-*i*. At this time, in order not to flow a current through an adjacent memory cell, a high potential (or a low potential) is applied to the write bit line located on one side of the adjacent memory cell and a low potential (or a high potential) is applied to the write bit line located on the other side of the adjacent memory cell.

Here, note that, in the second embodiment, the magnetic recording layer 4 of the memory array #1 and the magnetic recording layer 4 of the memory array #2 are physically separated from each other. Although the area increases when a partition is provided between the magnetic recording layers 4, for example, if a configuration in which four memory cell lines are integrated in each memory array is employed, it is possible to reduce the area per memory cell to five-eighths of that in the layout shown in FIG. 2. Further, if a configuration in which eight memory cell lines are integrated in each memory array is employed, it is possible to reduce the area per memory cell to nine-sixteenths. The voltages of the write bit lines are easily controlled. Further, input/output of data is separated for each memory array, so that, in the configuration of the second embodiment, a memory compiler necessary to generate embedded memory macros having various storage capacities can be easily created.

Third Embodiment

Figure 9:
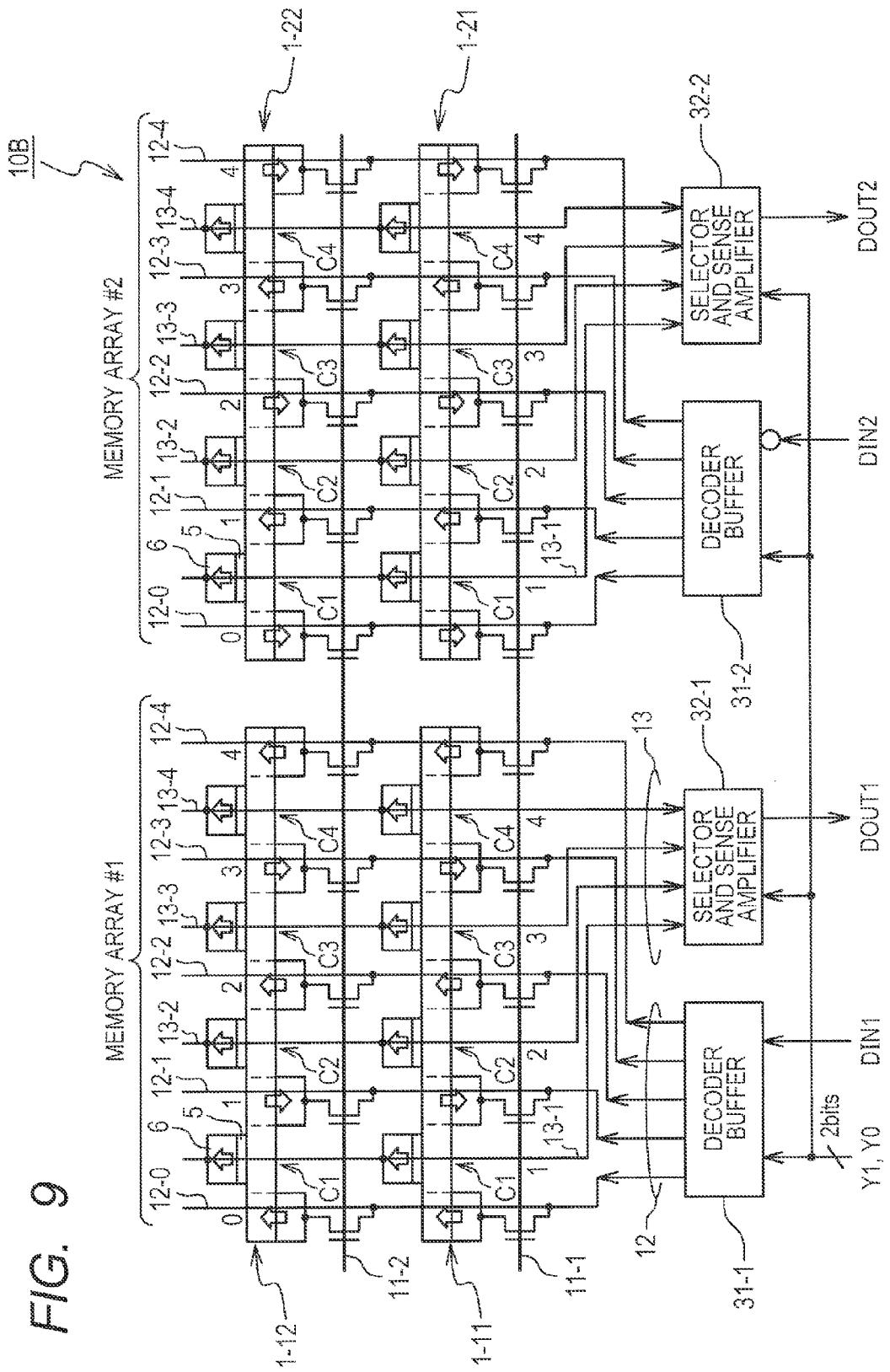
FIG. 9 is a diagram showing a configuration of a magnetoresistive random access memory of a third embodiment of the present invention.

FIG. 9 shows a configuration of a magnetoresistive random access memory 10B of a third embodiment of the present invention. The magnetoresistive random access memory 10B of the third embodiment has a configuration for reducing a bias magnetic field generated by the magnetization fixed layer 3. Specifically, in the second embodiment, the magnetization fixed layers 3 having the upward magnetization and the magnetization fixed layers 3 having the downward magnetization are alternately arranged in each memory cell line 1. On the other hand, considering the operation of decoding the Y address, it is preferred that the number of the columns of the memory cells is an even number such as 4 or 8. When the number of the columns of the memory cells is an even number, the number of magnetization fixed layers 3 in one memory cell line is an odd number, so that the magnetization directions of the magnetization fixed layers 3 at both ends are the same upward direction. Therefore, in the entire memory macro, the upward magnetization is somewhat dominant and an upward bias magnetic field is generated. The bias magnetic field is desired to be 0 from the viewpoint of magnetic design.

In the magnetoresistive random access memory 10B of the third embodiment, memory arrays in which there are many magnetization fixed layers 3 having an upward magnetic field and memory arrays in which there are many magnetization fixed layers 3 having a downward magnetic field are prepared in order to reduce the bias magnetic field. Specifically, as shown in FIG. 9, the three magnetization fixed layers 3-0, 3-2, and 3-4 of the memory cell lines 1-11 and 1-12 in the memory array #1 have an upward magnetization and the two magnetization fixed layers 3-1 and 3-3 have a downward magnetization. In short, the memory array #1 has many magnetization fixed layers 3 having an upward magnetization. On the other hand, in the memory array #2, each of the memory cell lines 1-21 and 1-22 includes three magnetization fixed layers 3-0, 3-2, and 3-4 having a downward magnetization and two magnetization fixed layers 3-1 and 3-3 having an upward magnetization. Thereby, in the entire magnetoresistive random access memory 10B, it is possible to reduce the bias magnetic field caused by the magnetization fixed layers 3.

However, in the memory array #2, the values of data written to the memory cells C1 to C4 by the write current in the same direction are opposite to those in the memory array #1. In order to maintain data coherency between the memory array #1 and the memory array #2, data inputted into the data input port DIN2 of the decoder buffer 31-2 of the memory array #2 is inverted and the inverted data is written to the memory cells in the memory array #2. Thereby, a circuit having the same configuration as that of the selector sense amplifier 32-1 of the memory array #1 can be used as the selector sense amplifier 32-2 of the memory array #2. This is an advantage for design.

Although not shown in FIG. 9, data may be inverted at the data output port DOUT2 of the selector sense amplifier 32-2 instead of inverting data at the data input port DIN2 of the decoder buffer 31-2. In both cases, the operations are equivalent in the entire memory array #2.

Fourth Embodiment

Figure 10:
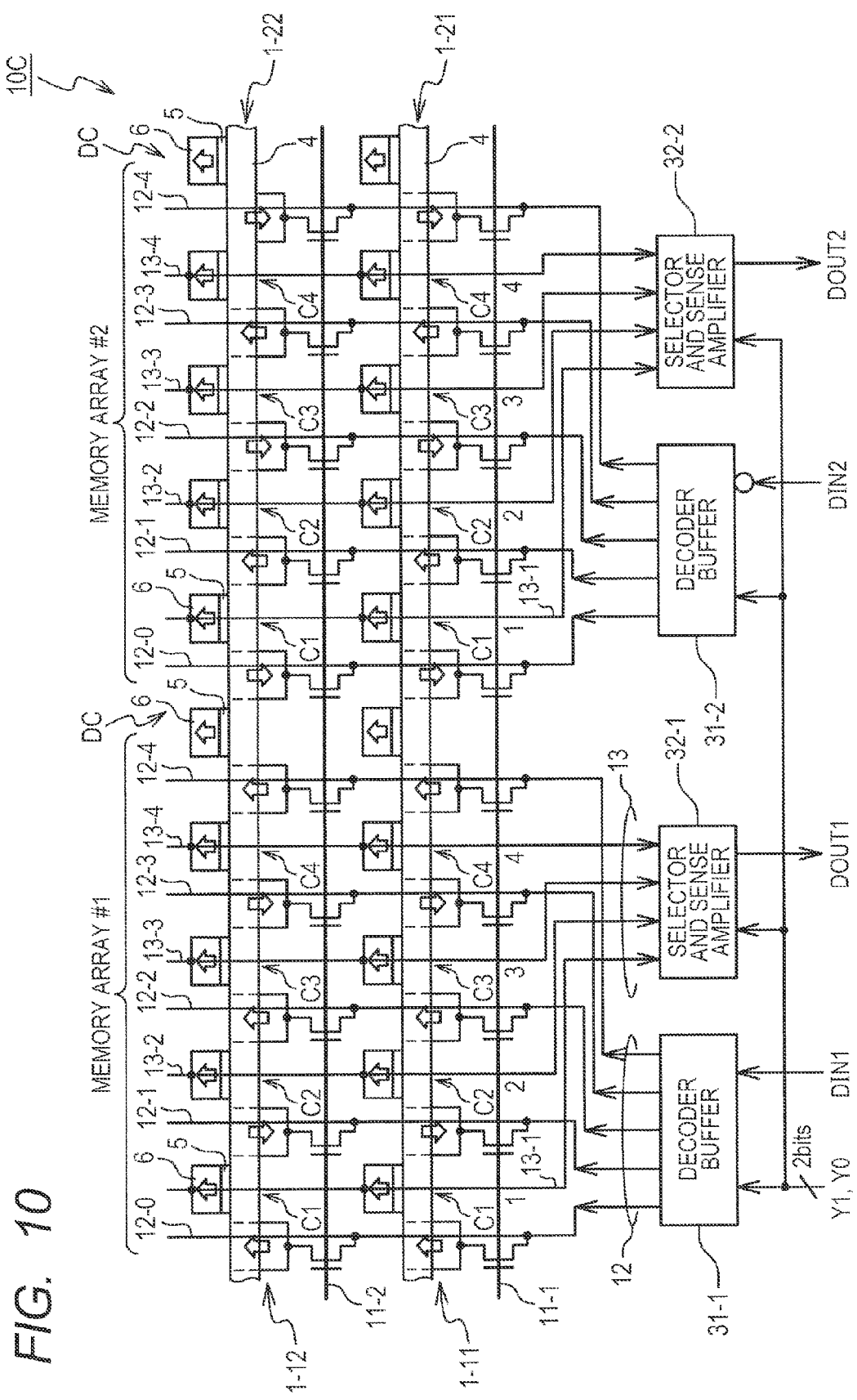
FIG. 10 is a diagram showing a configuration of a magnetoresistive random access memory of a fourth embodiment of the present invention.

FIG. 10 is a diagram showing a configuration of a magnetoresistive random access memory 10C of a fourth embodiment of the present invention. The fourth embodiment provides a configuration for reducing variation of the electric characteristics of the memory cell. In the configuration shown in FIG. 7A, the electric characteristics may be different between an intermediate memory cell and memory cells at both ends among the memory cells provided in each memory cell line 1 due to a manufacturing process. In particular, as miniaturization advances, variation of width and thickness of the magnetic recording layer 4 may occur between an intermediate portion and portions at both ends in each memory cell line 1 due to a difference of etching conditions. Thereby, the resistance values of the memory cells may differ from each other.

In the configuration of the fourth embodiment shown in FIG. 10, a countermeasure against the variation in the electric characteristics of the memory cells due to the manufacturing process is provided. Specifically, in the configuration of the fourth embodiment, the magnetic recording layers 4 coupled to the same word line 11 are coupled to each other. In such a configuration, there are only two memory cells located at both ends of the magnetic recording layers 4 among the memory cells coupled to a certain word line 11. There is the magnetic recording layer 4 between the memory arrays, so that each memory array does not have memory cells at both ends of the magnetic recording layer 4 at end portions of the memory array. In addition, the memory cells at both ends of the magnetic recording layer 4 are used as dummy cells DC, so that it is possible to avoid that the memory cells used to hold data are located at both ends of the magnetic recording layer 4.

Here, in the configuration shown in FIG. 10, a potential difference of the write bit lines occurs between the memory arrays. For example, the write bit line 12-4 of the memory array #1 and the write bit line 12-0 of the memory array #2 are adjacent to each other, and the potential of the write bit line 12-4 of the memory array #1 and the potential of the write bit line 12-0 of the memory array #2 may be different from each other depending on a combination of the value at the data input port DIN1 of the memory array #1 and the value at the data input port DIN2 of the memory array #2. In this case, a current inevitably flows through a portion of the magnetic recording layer 4 located between the memory arrays #1 and #2, so that it is impossible to hold meaningful data.

In order to suppress the potential difference of the write bit lines between the memory arrays adjacent to each other, in the present embodiment, the dummy cell DC is disposed at a portion of the magnetic recording layer 4 located between the memory arrays #1 and #2. The dummy cell DC is formed by laminating the spacer layer 5 and the reference layer 6 over the magnetic recording layer 4. In this configuration, an area necessary to provide the dummy cell DC between the memory arrays #1 and #2 is required. However, the area necessary to provide the dummy cell DC is substantially the same as that necessary to provide a gap area that separates the magnetic recording layers 4 from each other for each memory array, so that the area efficiency of the fourth embodiment is equivalent to that of the configurations of the second and the third embodiments.

It is not necessary to couple the read bit line 13 to the dummy cell DC. However, the read bit line 13 of the dummy cell may be added in order to emphasize the repetitive structure of the entire magnetoresistive random access memory 10C and obtain uniform electric characteristics.

In the fourth embodiment in which adjacent magnetic recording layers 4 are coupled to each other, the magnetization fixed layers 3 having the upward magnetization and the magnetization fixed layers 3 having the downward magnetization are alternately arranged for each magnetic recording layer 4. In this case, in the same manner as in the third embodiment, the values of data written to each memory cell in one memory array are opposite to the values of data written to each memory cell in the adjacent memory array by the write current in the same direction. To cope with this problem, like the third embodiment, the data inputted into the data input port DIN2 of the decoder buffer 31-2 of the memory array #2 may be inverted. Instead of the above, the data outputted from the data output port DOUT2 of the selector sense amplifier 32-2 may be inverted.

Fifth Embodiment

Figure 11:
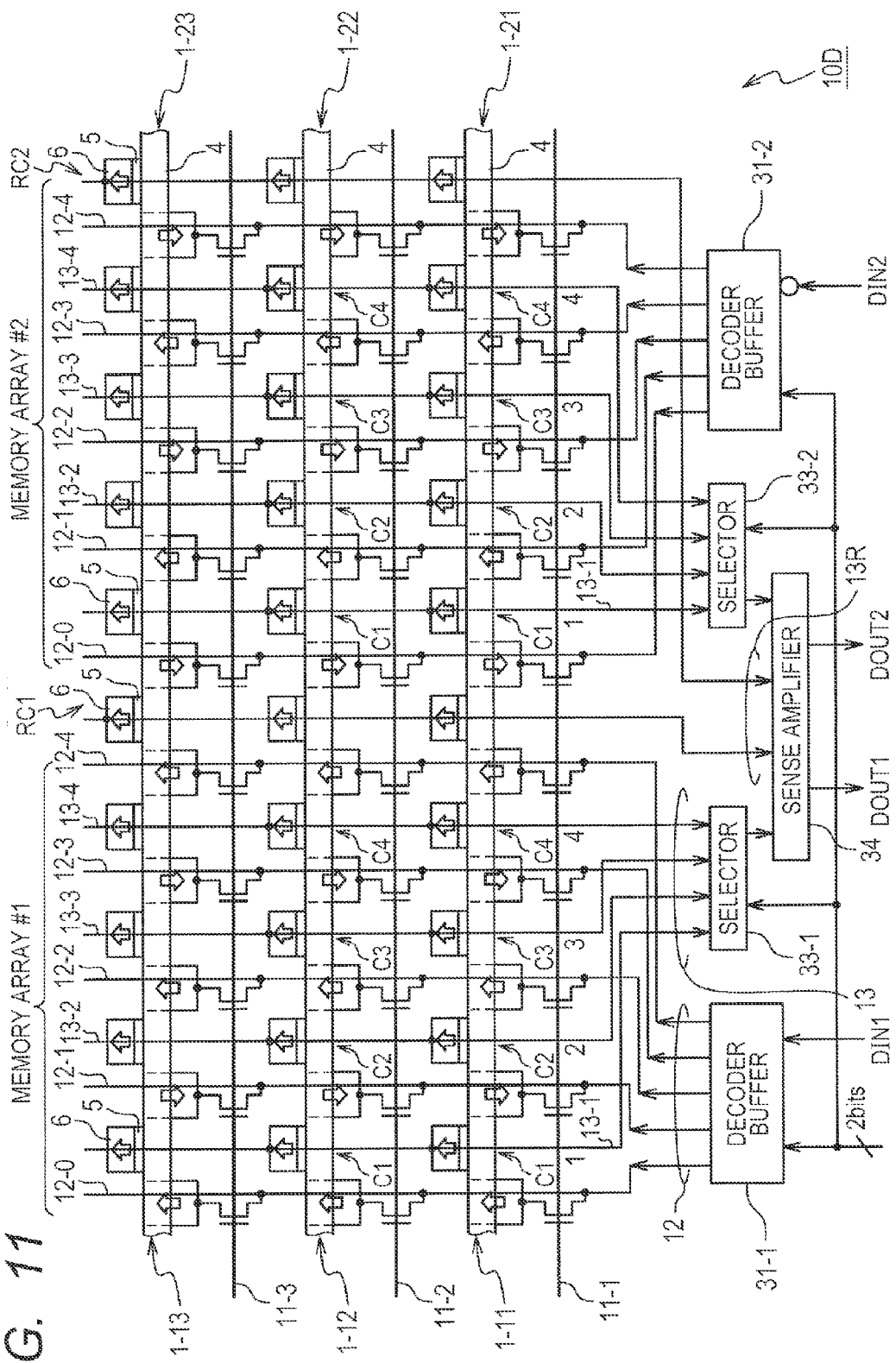
FIG. 11 is a diagram showing a configuration of a magnetoresistive random access memory of a fifth embodiment of the present invention.

FIG. 11 is a diagram showing a configuration of a magnetoresistive random access memory 10D of a fifth embodiment of the present invention. Generally, a magnetoresistive random access memory often has a configuration in which a read current obtained from a reference cell and a read current obtained from a memory cell are compared by a sense amplifier to determine whether the resistance value of the memory cell where data is actually recorded is high or low. In this configuration, the reference cell may be integrated separately from the memory array. Instead of the above, two memory arrays may be paired and when data is read from a memory cell in one memory array, a reference cell of the other memory array may be referred.

However, when the memory cells where data is stored and the reference cell are integrated in the same memory array, the effects of the variation of the electric characteristics in the chip can be suppressed, so that it is possible to improve the accuracy of determination of the data. The magnetoresistive random access memory 10D of the fifth embodiment has a configuration for reducing the effects of the variation of the electric characteristics in the chip.

Specifically, the magnetoresistive random access memory 10D of the fifth embodiment has a configuration as described below. Reference cell lines 1-13 and 1-23, in which reference cells RC1 and RC2 are arranged, are provided separately from the memory cell lines 1-11, 1-12, 1-21, and 1-22, in which the memory cells C1 to C4 where data is written are provided. A reference word line 11-3 is provided along the reference cell lines 1-13 and 1-23. Although only three word lines are shown in FIG. 11 to easily see the diagram, only one pair of reference sell lines and only one word line are required even when more than three word lines are provided.

In the same manner as in the fourth embodiment, the magnetic recording layers 4 of the memory cell lines 1 corresponding to the same word line are coupled to each other between the memory arrays #1 and #2. At this time, a memory cell located between memory arrays adjacent to each other is used as a dummy cell DC. Further, a cell which is located between the memory arrays #1 and #2 and which is provided over the magnetic recording layer 4 corresponding to the reference cell lines 1-13 and 1-23 is used as the reference cell RC1 and a cell which is located between the memory array #2 and the memory array (not shown in FIG. 11) adjacent to the memory array #2 and which is provided over the same magnetic recording layer 4 is used as the reference cell RC2. The reference cell RC1 is provided in a column of cells on the immediate right of the memory array #1 and the reference cell RC2 is provided in a column of cells on the immediate right of the memory array #2. A reference cell read bit line 13R is coupled to the reference layer 6 of the reference cells RC1 and RC2 and the reference cells RC1 and RC2 are coupled to the sense amplifier 34 through the reference cell read bit line 13R. The reference cells RC1 and RC2 are used to generate a reference current in the sense amplifier 34.

In the present embodiment, selectors 33-1 and 33-2 are provided to the memory arrays #1 and #2 respectively. On the other hand, the sense amplifier 34 is shared by the memory arrays #1 and #2. The selectors 33-1 and 33-2 selects a read bit line 13 responding to the Y address bits Y1 and Y0 during the read operation. The sense amplifier 34 determines the data of the memory cells to be read in the memory arrays #1 and #2 from the read currents flowing through the read bit lines 13 selected by the selectors 33-1 and 33-2.

The magnetization directions of the magnetization reversal domains 8 of the reference cells RC1 and RC2 are set so that one of the reference cells RC1 and RC2 is in a low resistance state and the other is in a high resistance state by flowing a current through the magnetic recording layer 4 in advance. The setting of the reference cells RC1 and RC2 can be performed by flowing a current in a specific direction through the magnetic recording layer 4 corresponding to the reference cell lines 1-13 and the 1-23. For example, the reference cell RC1 provided over the reference cell lines 1-13 and 1-23 can be set to a low resistance state and the reference cell RC2 can be set to a high resistance state by flowing a rightward current through the magnetic recording layer 4 corresponding to the reference cell lines 1-13 and the 1-23. Other reference cells coupled to the reference word line 11-3 can be set to the low resistance state and the high resistance state alternately. When flowing the current in the opposite direction, it is also possible to alternately arrange the reference cells in the high resistance state and the reference cells in the low resistance state. The current used to set the reference cells may be flowed through the write bit lines 12 or the current may be flowed by applying voltages to both ends of the magnetic recording layer 4.

When reading data from the memory arrays #1 and #2, the sense amplifier 34 generates the reference current which is an intermediate current between a current when a memory cell is in the high resistance state and a current when a memory cell is in the low resistance state by averaging the read current flowing through the reference cell RC1 and the read current flowing through the reference cell RC2. Further, the sense amplifier 34 determines whether the resistance value of the memory cell to be read is high or low by comparing the read current flowing through the memory cell to be read with the reference current. Here, a pair of the reference cell in the high resistance state and the reference cell in the low resistance state is used to generate the reference current, so that the sense amplifier 34 is shared by the memory arrays #1 and #2 and the sense amplifier 34 determines the resistance values of the memory cells to be read in the memory arrays #1 and #2 respectively at the same time.

Sixth Embodiment

Figure 12:
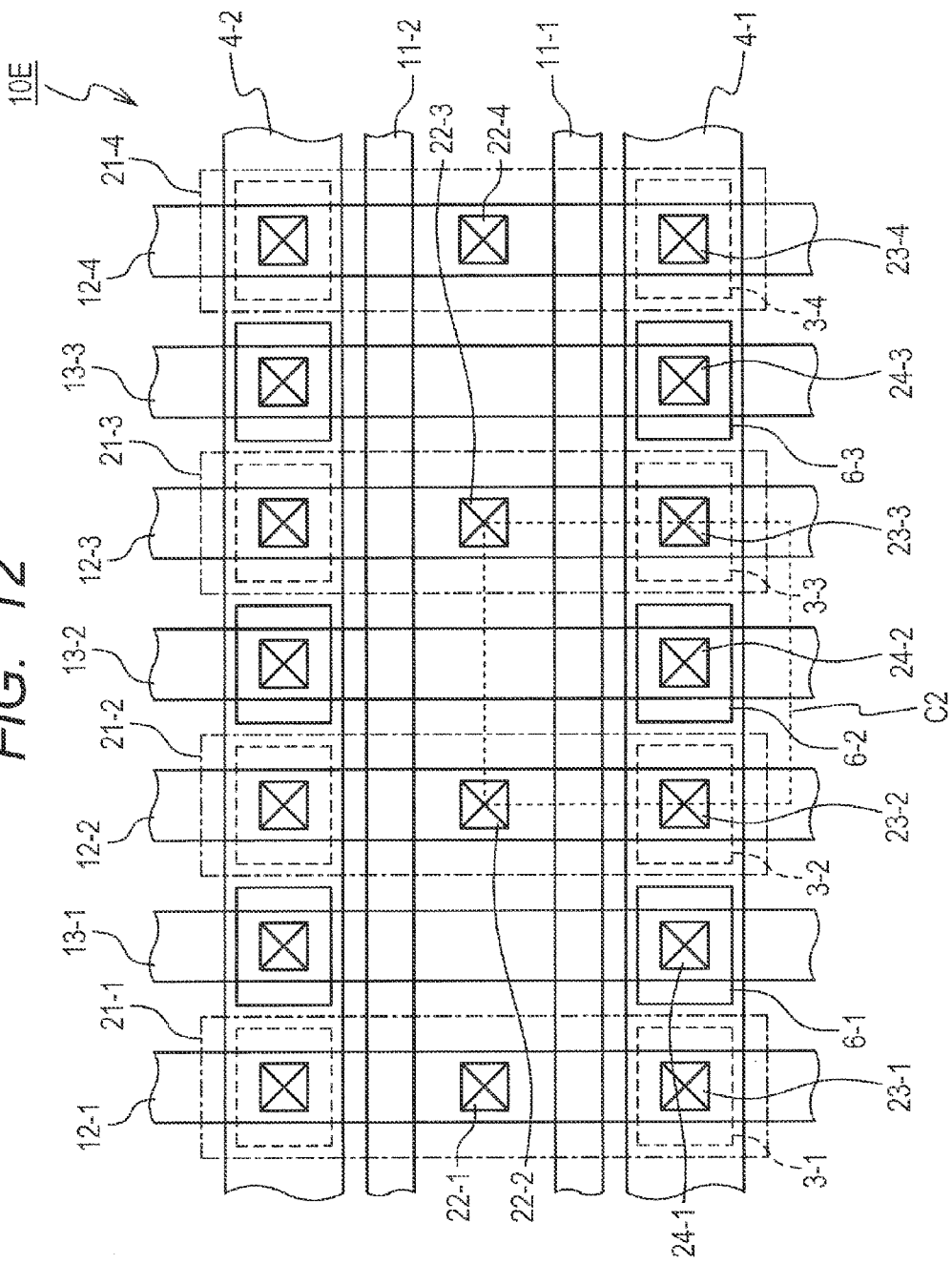
FIG. 12 is a diagram showing a configuration of a magnetoresistive random access memory of a sixth embodiment of the present invention.

FIG. 12 is a layout diagram showing a configuration of a magnetoresistive random access memory 10E of a sixth embodiment of the present invention. In FIG. 12, the memory cells adjacent to each other in a direction in which the write bit line 12 extends share the diffusion layer 21 and the via 22 that couples the diffusion layer 21 and the write bit line 12 together, so that the area of the memory cell is reduced.

Specifically, the word lines 11-1 and 11-2 are formed as polysilicon gates provided to cross the diffusion layers 21-1 to 21-4. The nMOS transistors 2-1 to 2-4 of the memory cell line 1-11 are made up of the diffusion layers 21-1 to 21-4 and the word line 11-1 and the nMOS transistors 2-1 to 2-4 of the memory cell line 1-12 are made up of the diffusion layers 21-1 to 21-4 and the word line 11-2.

The sources of the nMOS transistors 2-1 to 2-4 (that is, portions of the diffusion layers 21-1 to 21-4 between the word lines 11-1 and 11-2) are shared by the memory cells of the memory cell lines 1-11 and 1-12 and the shared sources are coupled to the write bit lines 12-1 to 12-4 through the vias 22-1 to 22-4, respectively. According to this layout, it is possible to effectively reduce the area per memory cell.

Although various embodiments are described above, the present invention should not be construed to be limited to the above embodiments. The present invention can be implemented with various modifications obvious to those skilled in the art. For example, although the number of the memory cells included in each memory cell line is four in the descriptions of the second to the fifth embodiments, the present invention can be implemented if the number of the memory cells included in each memory cell line is two or more. Note that a combination of the above embodiments can be implemented unless technical contradiction arises. For example, the layout of the magnetoresistive random access memory of the sixth embodiment can be applied to the magnetoresistive random access memories of the second to the fifth embodiments.

What is claimed is:

1. A magnetoresistive random access memory comprising:
   a first memory cell line in which first to Nth memory cells (N is an integer greater than or equal to 2) are formed; and
   first to (N+1)th write bit lines,
   wherein the first memory cell line includes
   a magnetic recording layer formed of a ferromagnetic body,
   first to (N+1)th magnetization fixed layers coupled to the magnetic recording layer,
   first to Nth reference layers provided to face the magnetic recording layer,
   first to Nth non-magnetic spacer layers inserted between the magnetic recording layer and the first to the Nth reference layers, respectively, and
   first to (N+1)th transistors,
   the ith reference layer (i ranges from 1 to N) and the ith spacer layer are located between the ith and the (i+1)th magnetization fixed layers,
   odd-numbered magnetization fixed layers among the first to the (N+1)th magnetization fixed layers have a magnetization fixed to a first direction,
   even-numbered magnetization fixed layers among the first to the (N+1)th magnetization fixed layers have a magnetization fixed to a second direction opposite to the first direction,
   the first to the Nth reference layers have a magnetization fixed to the first direction or the second direction, and
   the ith transistor is provided between the ith write bit line and the ith magnetization fixed layer,
   wherein data is written to the ith memory cell by flowing a write current between the ith write bit line and the (i+1)th write bit line through the ith and the (i+1)th transistors, and
   wherein data is written to the jth memory cell (j is an integer greater than or equal to 1 and smaller than or equal to N) by turning on the first to the (N+1)th transistors and then applying a first potential to the first write bit line when j=1, applying the first potential to the first to the jth write bit lines when j>1, applying a second potential different from the first potential to the (N+1)th write bit line when j=N, and applying the second potential to the (j+1)th to the (N+1)th write bit lines when j<N.

2. The magnetoresistive random access memory according to claim 1, wherein
   data is read from the kth memory cell (k is an integer greater than or equal to 1 and smaller than or equal to N) by turning on the first to the (N+1)th transistors, applying a third potential to the first to the Nth write bit lines, and applying a fourth potential different from the third potential to the kth reference layer.

3. The magnetoresistive random access memory according to claim 1, further comprising:
   a write circuit that applies potentials to the first to the (N+1)th write bit lines responding to an address and write data,
   wherein, when the jth memory cell is selected by the address, the write circuit applies the first potential to the first to the jth write bit lines and applies the second potential to the (j+1)th to the (N+1)th write bit lines.

4. The magnetoresistive random access memory according to claim 3, further comprising:
   a read circuit that reads data of the first to the Nth memory cells,
   wherein, when the write circuit writes a first data, which is one of data "0" and data "1", to any one of the first to the Nth memory cell, the write circuit applies potentials to the first to the Nth write bit lines so that the write current flows through the magnetic recording layer in a third direction, and when the write circuit writes a second data, which is the other one of data "0" and data "1", to any one of the first to the Nth memory cell, the write circuit applies potentials to the first to the Nth write bit lines so that the write current flows through the magnetic recording layer in a fourth direction opposite to the third direction, when the read circuit reads data of an odd-numbered memory cell of the first to the Nth memory cells, if a current flowing through the odd-numbered memory cell is larger than a reference current, the read circuit determines that the data stored in the odd-numbered memory cell is a third data, which is one of data "0" and data "1", and if the current is smaller than the reference current, the read circuit determines that the data is a fourth data, which is the other one of data "0" and data "1", and when the read circuit reads data of an even-numbered memory cell of the first to the Nth memory cells, if a current flowing through the even-numbered memory cell is larger than a reference current, the read circuit determines that the data stored in the even-numbered memory cell is the fourth data, and if the current is smaller than the reference current, the read circuit determines that the data is the third data.

5. A magnetoresistive random access memory comprising:
a plurality of memory arrays, each of which includes a memory cell line in which first to Nth memory cells are formed (N is an integer greater than or equal to 2) and first to (N+1)th write bit lines; and
a read circuit,
wherein the memory cell line includes
a magnetic recording layer formed of a ferromagnetic body,
first to (N+1)th magnetization fixed layers coupled to the magnetic recording layer,
first to Nth reference layers provided to face the magnetic recording layer,
first to Nth non-magnetic spacer layers inserted between the magnetic recording layer and the first to the Nth reference layers, respectively, and
first to (N+1)th transistors,
the ith reference layer (i ranges from 1 to N) and the ith spacer layer are located between the ith and the (i+1)th magnetization fixed layers,
the first to the Nth reference layers have a magnetization fixed to a first direction or a second direction opposite to the first direction,
the ith transistor is provided between the ith write bit line and the ith magnetization fixed layer, in the memory cell line of a first memory array of the plurality of memory arrays, odd-numbered magnetization fixed layers among the first to the (N+1)th magnetization fixed layers have a magnetization fixed to the first direction and even-numbered magnetization fixed layers among the first to the (N+1)th magnetization fixed layers have a magnetization fixed to the second direction, and in the memory cell line of a second memory array of the plurality of memory arrays, odd-numbered magnetization fixed layers among the first to the (N+1)th magnetization fixed layers have a magnetization fixed to the second direction and even-numbered magnetization fixed layers among the first to the (N+1)th magnetization fixed layers have a magnetization fixed to the first direction, wherein the magnetic recording layer of the memory cell line of the first memory array and the magnetic recording layer of the memory cell line of the second memory array are integrally formed into one body, wherein a dummy cell including a reference layer having a fixed magnetization and a non-magnetic spacer layer is provided at a position in the magnetic recording layer between the first memory array and the second memory array, and wherein each of the first and the second memory arrays includes a reference cell line having the same configuration as that of the memory cell line, the magnetic recording layer of the reference cell line of the first memory array and the magnetic recording layer of the reference cell line of the second memory array are integrally formed into one body, a first reference cell including a reference layer having a fixed magnetization and a non-magnetic spacer layer is provided at a position in the magnetic recording layer adjacent to the first memory array, a second reference cell including a reference layer having a fixed magnetization and a non-magnetic spacer layer is provided at a position in the magnetic recording layer adjacent to the second memory array, and the read circuit generates a reference current from a current flowing through the first reference cell and the second reference cell, compares a current flowing through the first to the Nth memory cells of the first and the second memory arrays with the reference current, and identifies data stored in the first to the Nth memory cells of the first and the second memory arrays.

* * * * *

UNITED STATES PATENT AND TRADEMARK OFFICE
CERTIFICATE OF CORRECTION

PATENT NO. : 9,293,183 B2
APPLICATION NO. : 13/572017
DATED : March 22, 2016
INVENTOR(S) : Kazumasa Suzuki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 705 days.

Signed and Sealed this
Twenty-eighth Day of June, 2016

Michelle K. Lee
*Director of the United States Patent and Trademark Office*